(12) United States Patent
Tomita

(10) Patent No.: US 6,460,110 B2
(45) Date of Patent: Oct. 1, 2002

(54) SEMICONDUCTOR MEMORY

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/017,702

(22) Filed: Feb. 5, 1998

(30) Foreign Application Priority Data

Aug. 22, 1997 (JP) ............................................. 9-226140

(51) Int. Cl.[7] ............................................. G06F 12/00
(52) U.S. Cl. ..................................... 711/1; 365/230.04
(58) Field of Search ........................... 365/200, 189.05, 365/189.07, 208, 230.03, 230.04; 711/5, 105, 102–103, 115, 161–162, 1, 100, 101, 157, 127; 714/6

(56) References Cited

U.S. PATENT DOCUMENTS

| | | | | |
|---|---|---|---|---|
| 5,347,484 A | * | 9/1994 | Kwong et al. | 365/49 |
| 5,438,546 A | * | 8/1995 | Ishac et al. | 365/200 |
| 5,659,509 A | * | 8/1997 | Golla et al. | 365/200 |
| 5,717,651 A | * | 2/1998 | Kikukawa | 365/233 |
| 5,732,030 A | * | 3/1998 | Dorney | 365/200 |

FOREIGN PATENT DOCUMENTS

| | | |
|---|---|---|
| JP | 59-5497 | 1/1984 |
| JP | 5-225796 | 9/1993 |

* cited by examiner

*Primary Examiner*—Matthew Kim
*Assistant Examiner*—Denise Tran
(74) *Attorney, Agent, or Firm*—Arent Fox Kinter Plotkin & Kahn, PLLC

(57) ABSTRACT

The present invention relates to a semiconductor memory having a pre-fetch structure. In such memory, an odd address cell array is provided with an odd address redundant cell array, and an even address cell array is provided with an even address redundant cell array, firstly, the present invention comprises a redundant memory, which stores an odd redundant address and an even redundant address, together with odd and even selection data. Since redundant memory is used flexibly on the odd side and even side, it is possible to maintain a high relief probability even when redundant memory capacity is reduced.

17 Claims, 19 Drawing Sheets

FIRST EMBODIMENT

FIG.3 REDUNDANT ROM AND REDUNDANT CELL ARRAY OF FIRST EMBODIMENT

FIG. 4 REDUNDANT CIRCUIT FIRST EMBODIMENT

FIG.6 59 REDUNDANT ROM CIRCUIT

FIG.7 RESET CIRCUIT 85, 86

REDUNDANT ADDRESS COMPARATOR AND REDUNDANT COLUMN SELECTOR

FIG.9

| ADDRESS MATCH / NOT MATCH | NOT MATCH | MATCH | MATCH | NOT MATCH |
|---|---|---|---|---|
| REDUNDANT ADDRESS 610/61E CFOxxX/CFExxX | H | L | H | L |
| ACCESSED ADDRESS 42,44/42,49 CAxxZO/CAxxZE | H | H | L | L |
| COMPARISON RESULT OUTPUT cajnz | L | H | H | L |

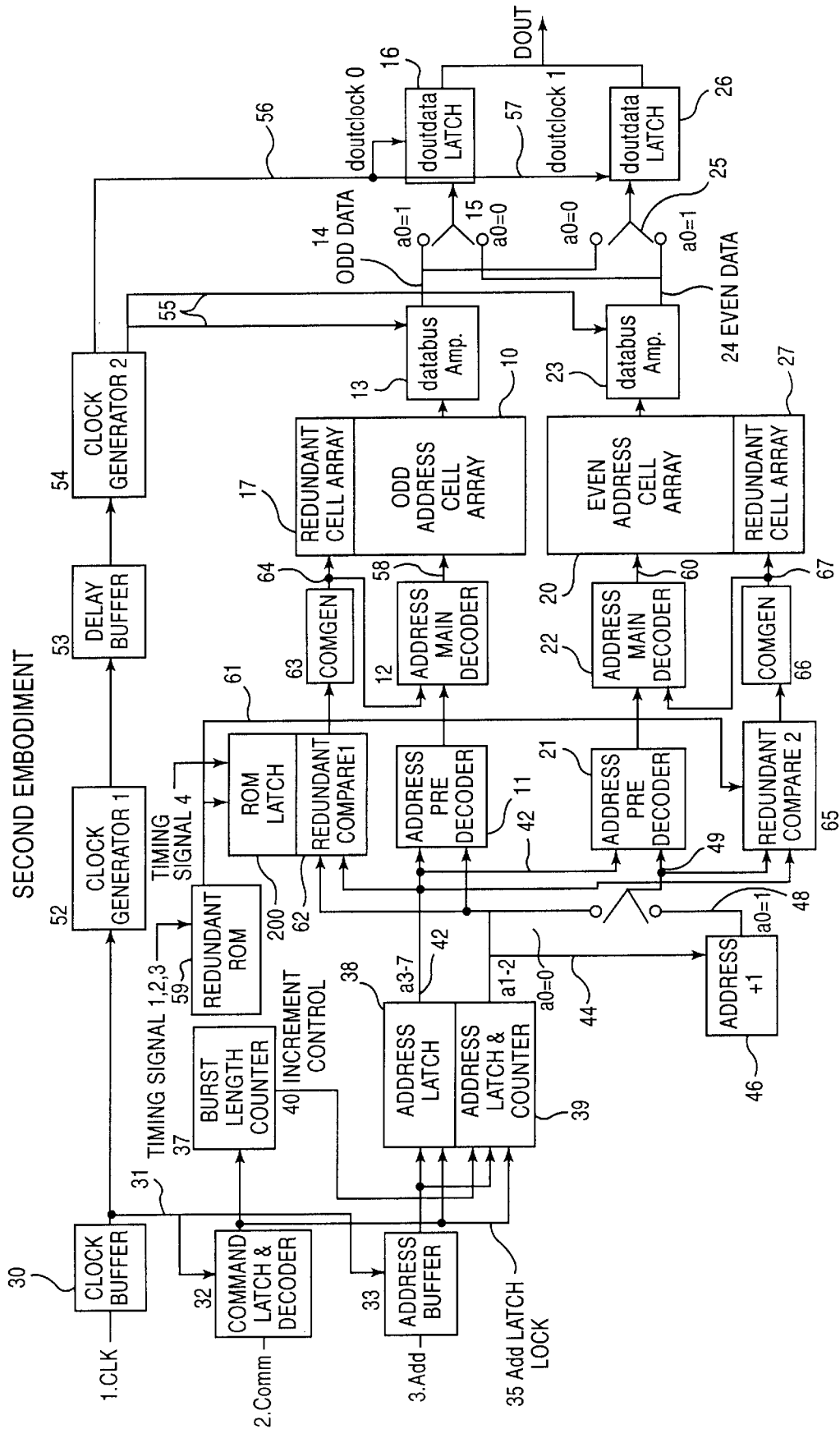

FIG. 11 SECOND EMBODIMENT

REDUNDANT ROM

FIG.13
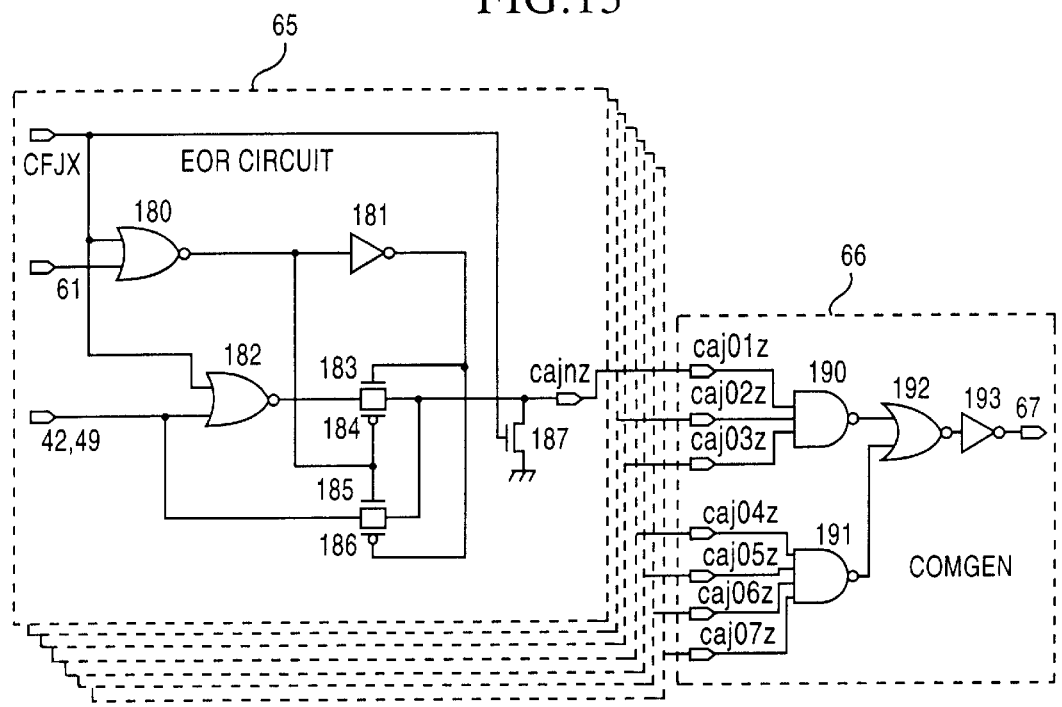
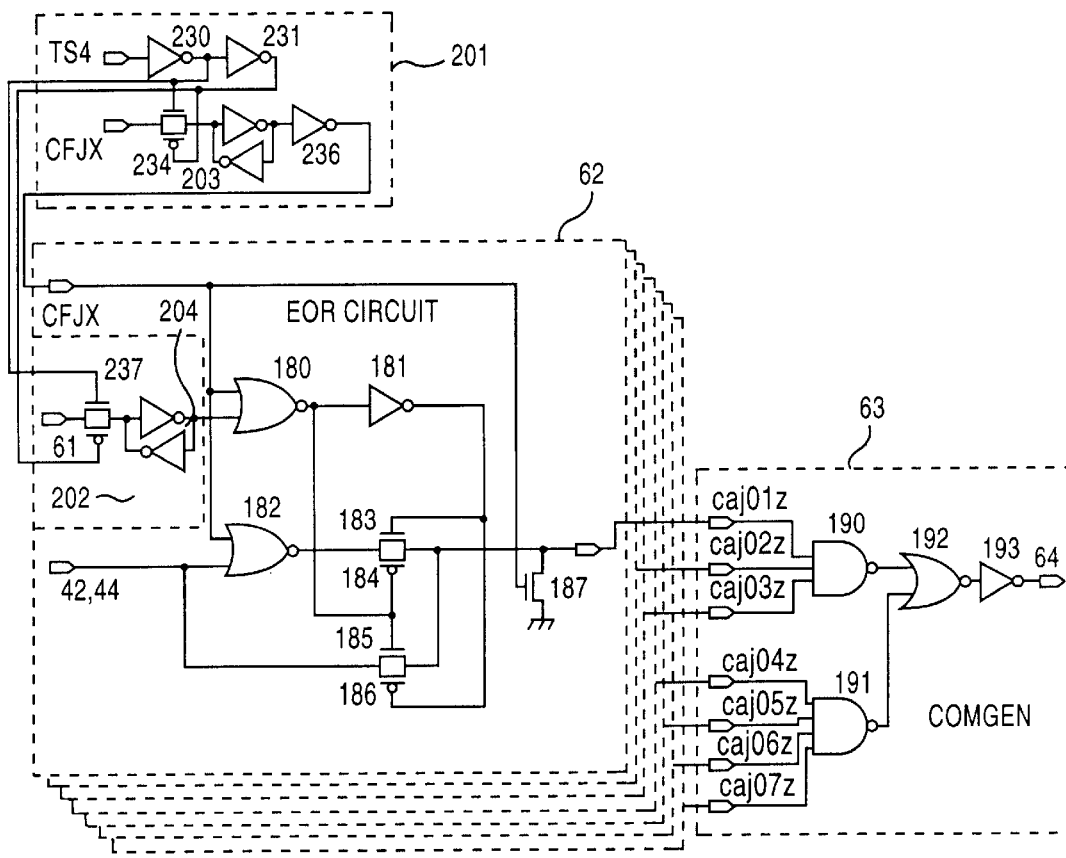

THIRD EMBODIMENT

REDUNDANT ADDRESS COMPARATOR AND
REDUNDANT COLUMN SELECTOR FOR FOURTH EMBODIMENT

FIFTH EMBODIMENT

SEMICONDUCTOR MEMORY

BACKGROUND OF THE INVENTION

1. Field of the Invention

The present invention is related to a semiconductor memory, and more particularly to a new configuration for redundant circuitry utilized in the burst mode in a 2-bit pre-fetch circuit or a multi-bit pre-fetch circuit of a synchronized dynamic random access memory (SDRAM).

2. Description of the Related Art

A synchronized DRAM (hereafter referred to simply as SDRAM) is a DRAM that performs internal operations in synch with a system-supplied clock, and is capable of faster operation than an ordinary DRAM. This SDRAM is also supplied with system-supplied command signals, which specify operating modes. By internally decoding these applied command signals, the SDRAM determines the system-requested operating mode, and, for example, outputs read data in accordance with a specified operating mode.

One of the above-mentioned operating modes is a burst mode. Increasing clock speeds have made it impossible for internal memory operations to be performed within a single clock cycle. This burst mode allows the simultaneous reading and writing of a plurality of addresses, and writes or outputs the memory data of sequential addresses that have an externally-supplied address as their starting address. Accordingly, the number of sequentially outputted bits are specified as 2-bit, 4-bit or 8-bit.

With such a burst mode, an SDRAM internally generates consecutive addresses based on an external address, and outputs memory data by decoding these addresses. With a 2-bit burst mode, a single internal address is generated. With a 4-bit burst mode, one internal address is generated, and during the next clock cycle, two internal addresses are generated. And with an 8-bit burst mode, one internal address is generated, and during the next three clock cycles, two internal addresses are generated per cycle.

Under these circumstances, the internal memory cell array of an SDRAM is divided into an odd address memory cell array and an even address memory cell array, and in the burst mode, an SDRAM supplies an externally-supplied or internally-generated address, whose least significant bit is removed, to the column decoders of the odd address memory cell array and the even address memory cell array. The use of such an architecture enables the sequential output of 2-bit memory data at all times. This architecture is called a 2-bit pre-fetch circuit. Similarly, a 4-bit pre-fetch circuit, which enables the simultaneous reading and writing of 4-bit memory data, is also possible. In this case, addresses whose least significant two bits are removed are supplied to the respective column decoders of four memory cell arrays.

FIG. 1 depicts an example of a 2-bit pre-fetch circuit in a conventional SDRAM. In this example, the memory cell array is divided into an odd address memory cell array 10 and an even address memory cell array 20. And for each memory cell array 10, 20, an address predecoder 11, 21 and address main decoder 12, 22 are provided. In addition, the output from each memory cell array 10, 20 is amplified by a data bus amp 13, 23.

SDRAM operates in synch with a system-supplied clock CLK. Therefore, according to the timing of a clock 31 outputted from a clock buffer 30, which captures the clock CLK, a command signal 2 (Comm) is latched to a command latch & decoder 32, and an address signal 3 (Add) (in this example, eight bits from a0 to a7) is latched to an address buffer 33. And then, an address signal a3–a7 from the address buffer 33 is latched to an address latch 38 based on the timing of an address latch clock 35 generated by the command latch & decoder 32. An address signal a1, a2 is also latched to an address latch and counter 39 based on the same clock 35.

An address signal a3–a7 is supplied as-is to odd and even address predecoders 11, 21. Meanwhile, an address a1, a2 is supplied as-is to the odd address predecoder 11. An address a1, a2 is also supplied to the even address predecoder in accordance with the value of the least significant address a0, that is, according to whether it is odd or even, either as-is as a latched address 44 or as a new shifted address 48, in which the address is incremented by 1 by an address arithmetic circuit 46.

Thus, when the external address is even, even memory data 24 amplified by an even data bus amp 23 is latched to an output data latch 16 based on clock 56 timing, and then odd memory data 14 amplified by an odd data bus amp 13 is latched to an output data latch 26 based on clock 57 timing, and even and odd data are sequentially outputted in that order through output terminal DOUT.

Further, when the external address is odd, odd memory data 14 is latched to the output data latch 16, and even memory data is latched to the output data latch 26, based on timing supplied by clocks 56, 57, respectively, and odd and even data are sequentially outputted in that order.

In line with increasing memory capacity, a redundant cell array is being added to a memory cell array to prevent a drop in memory yield. In line with adding such a redundant cell array, it is necessary to provide a redundant address read-only memory (ROM), which stores the address of a defective cell substituted for by a redundant cell array, and an EOR circuit, or a redundant address comparator, which determines whether or not this redundant address matches the address currently being accessed.

However, when a redundant cell array architecture is applied to memory in the above-described 2-bit pre-fetch circuit architecture, because there are an internal odd address cell array 10 and even address cell array 20, it is necessary to provide a redundant cell array, and both a redundant column address ROM and redundant address comparator for each cell array. Firstly, since this involves providing duplicate redundant column address ROM and redundant address comparators, the size of the circuit architecture increases. And secondly, when a redundant cell array is provided for both the odd and even cell arrays, when each has a redundant column address ROM, these redundant column address ROM cannot be used efficiently. That is, judging from the probability of a defective cell occurring, there is less probability of both the odd address cell array and the even address cell array using an entire redundant cell array. Therefore, there is an extremely low probability both redundant column address ROM for both cell arrays will utilize 100% of their capacity for storing redundant addresses. The above-mentioned problem is the same for a 4-bit pre-fetch architecture, and is generally also the same for multi-bit pre-fetch architectures.

SUMMARY OF THE INVENTION

Thus, an object of the present invention is to provide a semiconductor memory with an efficient architecture for the redundant circuitry of a redundant cell array for a multi-bit pre-fetch circuit architecture.

Another object of the present invention is to provide a semiconductor memory with an efficient architecture for a redundant ROM, which stores a redundant address of a redundant circuit of a redundant cell array for a 2-bit or larger multi-bit pre-fetch circuit architecture.

Another object of the present invention is to provide a semiconductor memory with an efficient architecture for redundant address wiring from a redundant column address ROM to a redundant address comparator.

Another object of the present invention is to provide a semiconductor memory with an efficient architecture for a redundant address comparator of a redundant circuit of a redundant cell array for a 2-bit or larger multi-bit pre-fetch circuit architecture.

Another object of the present invention is to provide a semiconductor memory with an efficient architecture for a redundant address comparator of a redundant circuit.

To achieve the above-stated objects in a memory, in which an odd address cell array is provided with an odd address redundant cell array, and an even address cell array is provided with an even address redundant cell array, firstly, the present invention comprises a redundant memory, which stores an odd redundant address and an even redundant address, together with odd and even selection data. Since redundant memory is used flexibly on the odd side and even side, it is possible to maintain a high relief probability even when redundant memory capacity is reduced.

The present invention can be applied to a 4-bit or larger multi-bit pre-fetch circuit architecture. For example, a 4-bit pre-fetch architecture internally comprises a first address group memory cell array and redundant cell array, a second address group memory cell array and redundant cell array, a third address group memory cell array and redundant cell array, and a fourth address group memory cell array and redundant cell array. In this case, redundant memory stores redundant addresses for the first through the fourth address groups, together with selection data for the first through the fourth address groups. This holds the same for 8-bit and larger pre-fetch architectures as well. Therefore, the invention applies to a semiconductor memory, which, at a minimum, comprises at least a first address group and a second address group memory cell array and redundant cell array.

The above-mentioned first invention is a semiconductor memory, having a first address group cell array corresponding to a first address group, and a second address group cell array corresponding to a second address group, said semiconductor memory comprising: a first address group redundant cell array, which can be substituted for a defective cell of the above-mentioned first address group cell array; a second address group redundant cell array, which can be substituted for a defective cell of the above-mentioned second address group cell array; a redundant memory, which stores a first address group redundant address or a second address group redundant address corresponding to the above-mentioned defective cell, together with first and second address group selection data corresponding thereto; a first address group redundant address comparator, which compares a redundant address of the above-mentioned first address group supplied from the above-mentioned redundant memory with an address of a first address group to be accessed, and when they match, effectuates the selection of the above-mentioned first address group redundant cell array; and a second address group redundant address comparator, which compares a redundant address of the above-mentioned second address group supplied from the above-mentioned redundant memory with an address of a second address group to be accessed, and when they match, effectuates the selection of the above-mentioned second address group redundant cell array.

A second invention supplies an odd redundant address and even redundant address in a redundant memory in the first invention to an odd redundant address comparator and an even redundant address comparator via separate redundant address lines.

Furthermore, a third invention is a modification of the second invention, and supplies, on a time-sharing basis, an odd redundant address and even redundant address in a redundant memory in the first invention to an odd redundant address comparator and an even redundant address comparator via a common redundant address line. The above-described second and third present inventions can also be applied to 4-bit and larger multi-bit pre-fetch circuit architectures.

A fourth invention is a semiconductor memory with a 2-bit pre-fetch architecture, which comprises an odd address cell array and an even address cell array, this semiconductor memory providing each cell array with a redundant cell array, and comprising redundant address comparators corresponding to each redundant cell array, these comparators being comprised of a redundant address comparator for a common upper address, and an odd redundant address comparator and an even redundant address comparator for individual lower addresses. This simplifies a redundant address comparator. The present invention can also be applied to 4-bit and larger multi-bit pre-fetch circuit architectures.

The above-mentioned fourth invention is a semiconductor memory, having a first address group cell array corresponding to a first address group, and a second address group cell array corresponding to a second address group, said semiconductor memory comprising: a first address group redundant cell array, which can be substituted for a defective cell of the above-mentioned first address group cell array; a second address group redundant cell array, which can be substituted for a defective cell of the above-mentioned second address group cell array; a redundant memory, which stores a redundant address corresponding to the above-mentioned defective cell; a first address group lower redundant address comparator, which compares a lower address of the above-mention redundant address supplied from the above-mention redundant memory with a lower address of the first address group to be accessed; a second address group lower redundant address comparator, which compares a lower address of the above-mentioned redundant address supplied from the above-mentioned redundant memory with a lower address of the second address group to be accessed; and a common upper redundant address comparator, which compares an upper address of the above-mentioned redundant address supplied from the above-mentioned redundant memory with a common upper address of a first address group and second address group to be accessed.

In addition, when there are a plurality of redundant cell arrays, which relief defective cells in a cell array, regardless of whether it is odd or even, a fifth invention stores in redundant memory the redundant addresses of these defective cells, together with selection data for a plurality of redundant cell arrays, supplies, on a time-sharing basis, redundant addresses to redundant address comparators corresponding to a plurality of redundant cell arrays. As a result, it is possible to simplify the lines from redundant memory to redundant addresses.

The above-described fifth invention is a semiconductor memory, having a cell array, and a plurality of redundant cell arrays, which are capable of substituting for a defective cell in this cell array, said semiconductor memory comprising: a redundant memory, which stores a redundant address corresponding to the above-mentioned defective cell, together with selection data for the above-mention plurality of redundant cell arrays; wherein a redundant address comparator, which is provided for each of the above-mentioned redundant cell arrays, and which compares the above-mentioned redundant address supplied from the above-mentioned redundant memory with the address to be accessed, and when they match, effectuates the selection of the corresponding above-mentioned redundant cell array; wherein the above-mentioned redundant memory supplies to the above-mentioned plurality of redundant address comparators, on a time-sharing basis, the plurality of above-mentioned redundant addresses stored in accordance with the above-mentioned selection data.

Furthermore, in an N-bit pre-fetch architecture (where N=$_2$m, and M is an integer of 1 or larger), there are number of both address groups and memory cell arrays.

BRIEF DESCRIPTION OF THE DRAWINGS

FIG. 9 is a table depicting the relationship between a redundant address 61O, 61E and an accessed address.

FIG. 10 depicts a block diagram of the second embodiment.

FIG. 11 depicts the entire architecture of the redundant circuitry of the second embodiment.

FIG. 13 depicts the detailed circuitry of the redundant address comparators.

DESCRIPTION OF THE PREFERRED EMBODIMENTS

Figure 1:
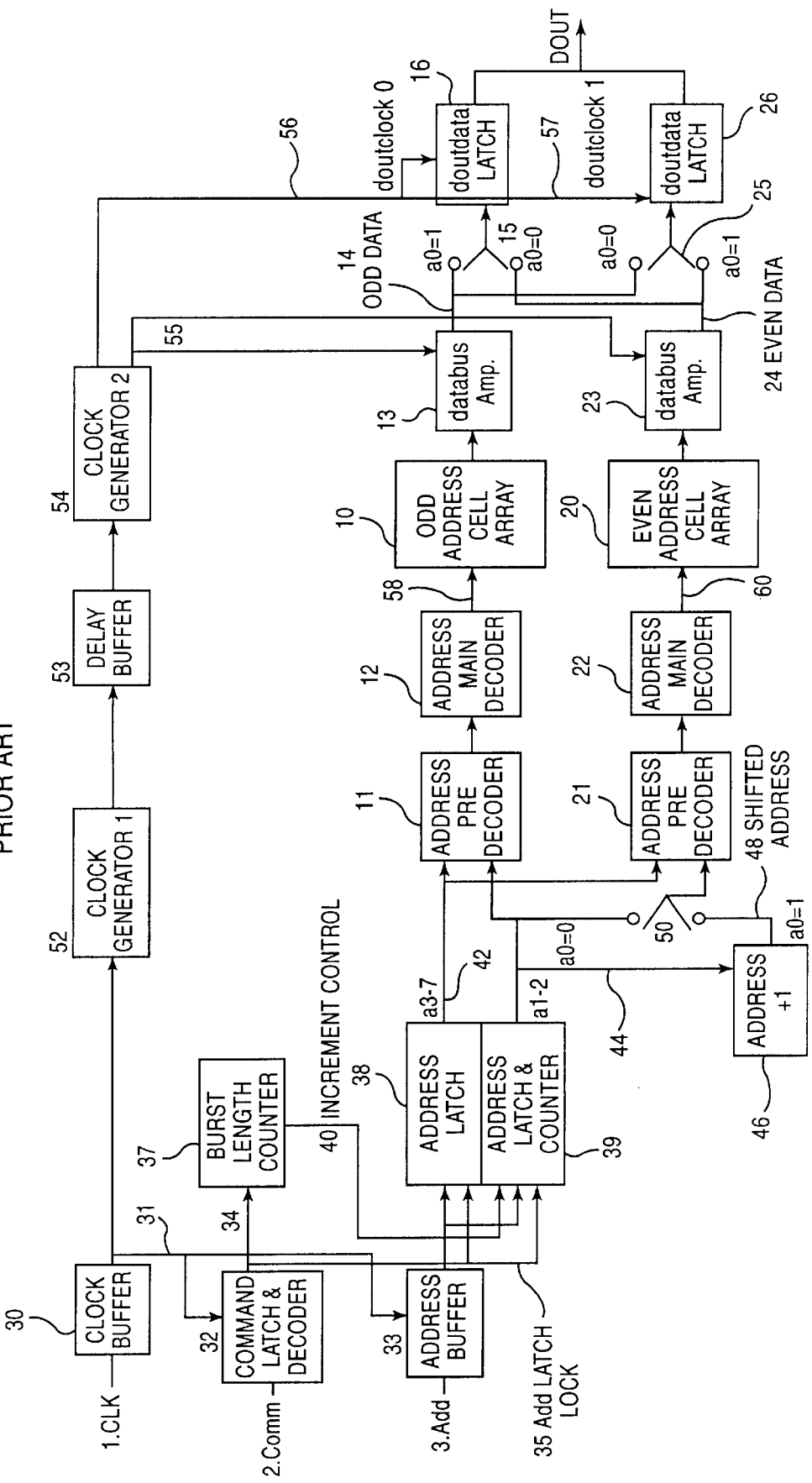
FIG. 1 is depicts an example of a 2-bits pre-fetch circuit in a conventional SDRAM.

Examples of embodiments of the present invention are explained below with reference to drawings. However, the technological scope of the present invention is not limited to these embodiments. Further, in the drawings, transistors with circles for gates are P-type transistors; all other transistors are N-type transistors. Furthermore, signal symbols followed by the letter Z indicate signals that are active at low (L) level, and those followed by an X are active at high (H) level.

A semiconductor memory of the present invention can be applied to DRAM, static RAM (SRAM) and other memory, which require redundant cells. The embodiment described below is an example of the present invention being applied to a synchronized DRAM. Furthermore, although the present invention can be widely applied to multi-bit pre-fetch circuit architectures, the following embodiment is an example of the present invention being applied to a 2-bit pre-fetch circuit.

Figure 2:
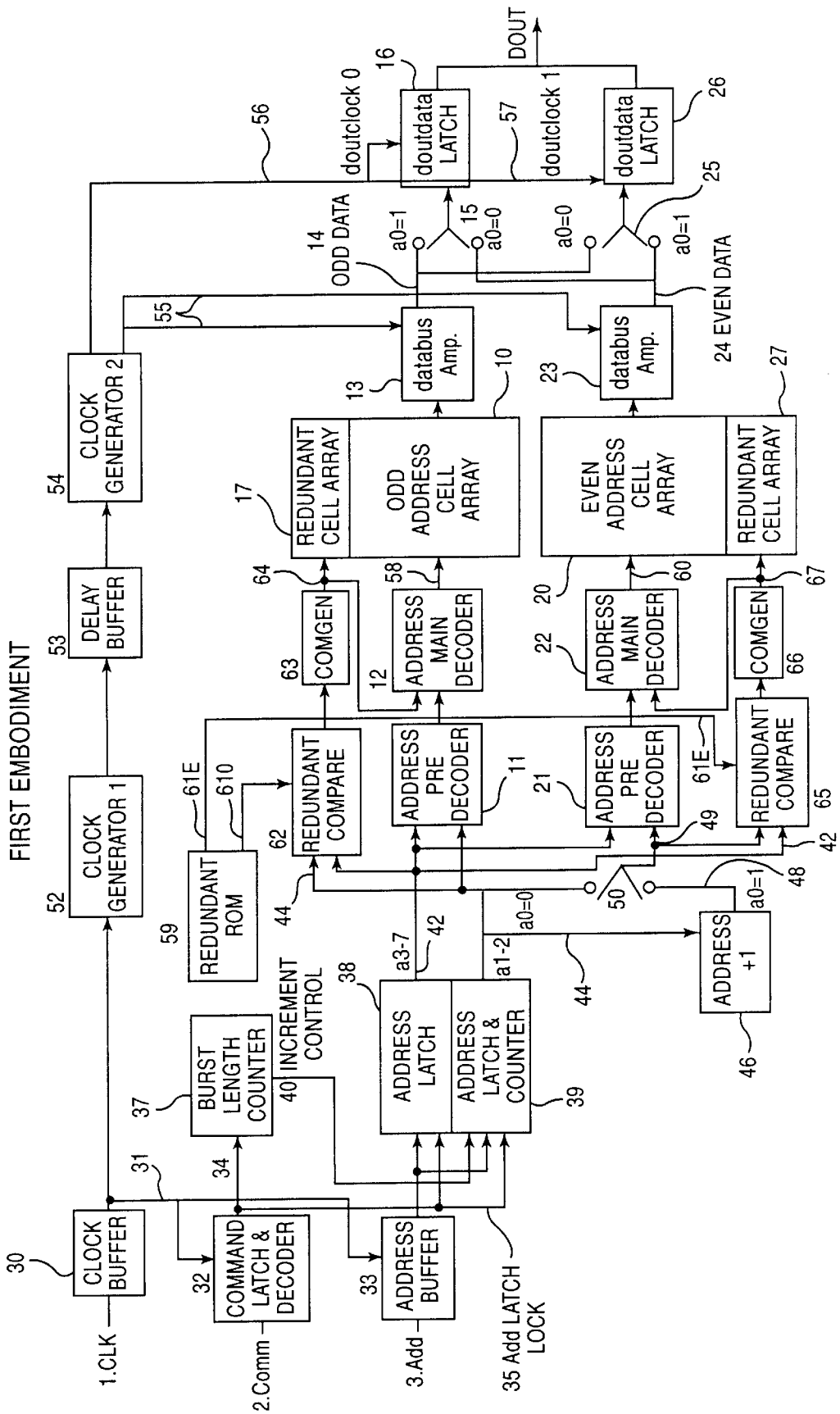
FIG. 2 depicts a block diagram of the first embodiment of the present invention.

FIG. 2 depicts a block diagram of the first embodiment of the present invention. In this figure, the same reference numbers are assigned to parts that correspond to those depicted in FIG. 1. That is, the memory array is divided into an odd address cell array 10 and an even address cell array 20, and an address predecoder 11, 21, an address main decoder 12, 22 and a data bus amplifiers 13, 23 are provided for each cell array. Odd data 14 and even data 24 in a data bus amp 13, 23, as described above, is latched to an output data latch 16, 26 according to whether the address to be accessed is odd or even. An external clock 1 is amplified by a clock input buffer 30, and a latch signal 55 for data bus amplifiers 13, 23 and a output clocks 56, 57 for output data latch 16, 26 output clock 56, 57 are generated via a clock generator 52, a delay buffer 53 and a clock generator 54.

In the first embodiment depicted in FIG. 2, a redundant cell array 17 is provided for an odd address cell array 10, and a redundant cell array 27 is provided for an even address cell array 20. Also, a redundant address comparator (EOR circuit) 62, 65 and redundant column selector 63, 66 are provided for each redundant cell array 17, 27. A redundant column selection signal 64, 67 of a redundant column selector 63, 66 is applied to each redundant cell array 17, 27 at the same time that this signal is applied to an address main decoder 12, 22 as a selection prohibit signal.

The first embodiment depicted in FIG. 2 is characterized in that it provides for a common redundant ROM 59, which stores column addresses of defective cell arrays substituted for by both redundant cell arrays 17, 27. That is, a redundant ROM 59 stores a redundant column address of a defective array in an odd address cell array and a redundant column address of a defective array in an even address cell array, together with odd or even data. Furthermore, the redundant ROM 59 also stores addresses from a plurality of memory blocks into which a memory cell array is divided. As a result, the storage areas of the redundant ROM 59 are flexibly allotted to odd redundant addresses and even redundant addresses in a plurality of memory blocks. This embodiment can also be applied to memory with 4-bit and larger pre-fetch architectures.

Figure 3:
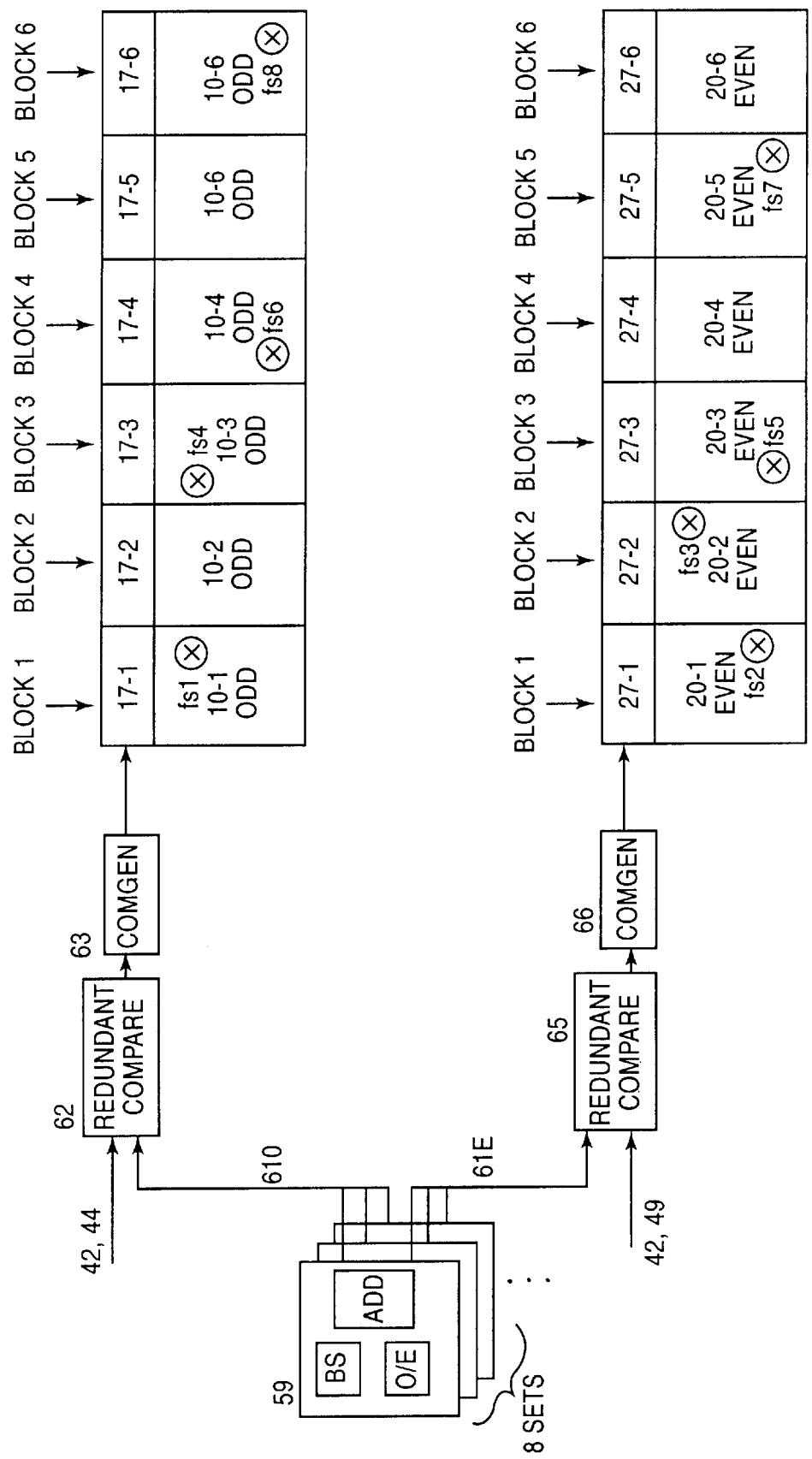
FIG. 3 depicts the relationship between the above-described redundant ROM and redundant cell array.

FIG. 3 depicts the relationship between the above-described redundant ROM and redundant cell array. In this example, a memory cell array is divided into six blocks. That is, an ordinary odd address cell array 10-1~10-6 and a respective redundant cell array 17-1~17-6 is provided on the odd side, and an ordinary even address cell array 20-1~20-6 and a respective redundant cell array 27-1~27-6 is provided on the even side. Relative thereto, a redundant ROM 59 comprises capacity for storing only eight sets of redundant column addresses.

Then, in the example in FIG. 3, a defective cell fs1 exists in Block 1 of the odd cell array 10-1, a defective cell fs2 exists in Block 1 of the even cell array 20-1, a defective cell fs3 exists in Block 2 of the even cell array 20-2, a defective cell fs4 exists in Block 3 of the odd cell array 10-3, a defective cell fs5 exists in Block 3 of the even cell array 20-3, a defective cell fs6 exists in Block 4 of the odd cell array 10-4, a defective cell fs7 exists in Block 5 of the even cell array 20-5, and a defective cell fs8 exists in Block 6 of the odd cell array 10-6.

The address of these defective cells fs1–fs8 are stored by redundant ROM 59, which has the capacity to store eight sets of redundant column addresses. Then, judging from the state depicted in FIG. 3, the probability of defective cells occurring in odd cell array 10-2, 10-5, and of defective cells occurring in even cell array 20-4, 20-6 as well is fairly low. Therefore, the fact that redundant ROM 59 flexibly allots storage area for odd and even redundant addresses in a plurality of memory blocks makes it possible to substitute a redundant cell array for a defective cell with a reasonably high probability even when the storage capacity of the redundant ROM 59 is less than the capacity required when all redundant cell arrays are used.

Therefore, in addition to redundant column addresses, the address of the block to which a redundant address belongs, and data as to whether it is odd or even are also stored in redundant ROM 59. See B/S for address of block and D/E for odd or even. Since, based on the probability of a defective cell array occurring, the probability of using the entire odd redundant cell array 17 and the entire even redundant cell array 27 to substitute for defective cell arrays is extremely low, from a practical standpoint, not much trouble will occur even if the storage capacity of the redundant ROM 59 is reduced as described above.

Furthermore, in the first embodiment, to make multi-cell selection possible for each redundant cell array, it is necessary to provide the redundant circuitry depicted in FIG. 3 with a multi-set architecture.

A column address (a3–a7) 42 and a column address (a1, a2) 44 are applied to an odd redundant address comparator 62 as the column address being accessed, and a column address (a1–a7) 61O stored in redundant ROM 59 is applied to the odd redundant address comparator 62 as a redundant address, and both addresses are compared. Further, a column address (a3–a7) 42 and an address 49, which is either a column address (a1, a2) 44, or a shifted address (a1', a2') 48, are applied to an even redundant address comparator 65 as the column address being accessed, and a column address (a1–a7) 61E stored in redundant ROM 59 is applied to the even redundant address comparator 65 as a redundant address, and both addresses are compared. Since this is a 2-bit pre-fetch circuit architecture, the least significant bit of a column address (a0) is not applied to a redundant address comparator 62, 65, and is not stored in redundant ROM 59.

A characteristic of the first embodiment is that redundant addresses of an odd address redundant cell array 17-1~17-6 and an even address redundant cell array 27-1~27-6 for the same blocks can be stored in redundant ROM 59. Therefore, the redundant address lines from redundant ROM 59 to the redundant address comparators 62, 65 are provided separately as an odd line 61O and an even line 61E.

Furthermore, when applying the first embodiment to a memory with a 4-bit pre-fetch architecture, in addition to a +1 circuit, a +2 circuit and a +3 circuit are added to the address arithmetic circuit, and a predecoder, main decoder, memory cell array and redundant address comparator are provided for the +2 circuit and +3 circuit, respectively.

Figure 4:
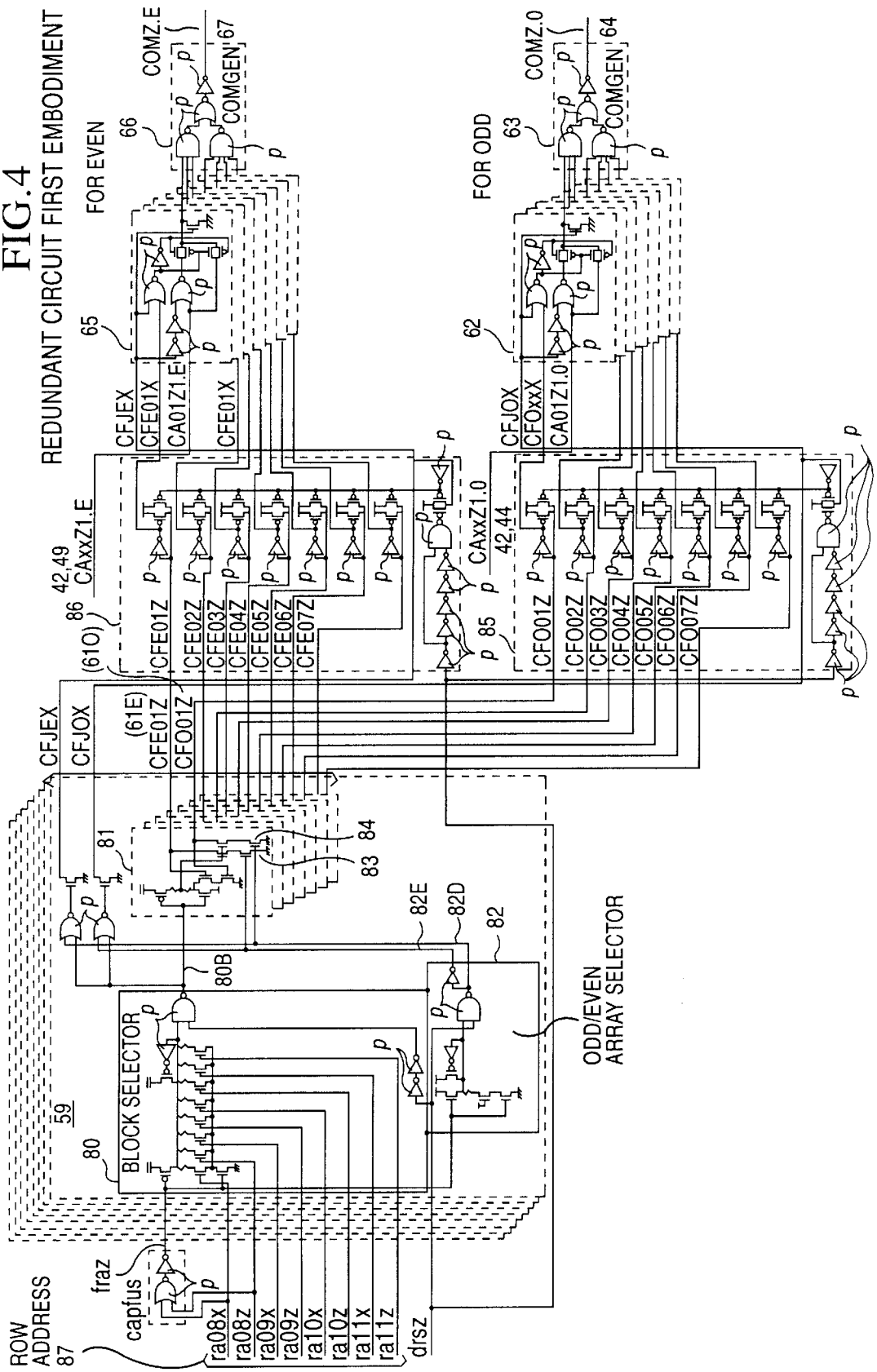
FIG. 4 depicts the overall architecture of the redundant circuitry the first embodiment.
Figure 5:
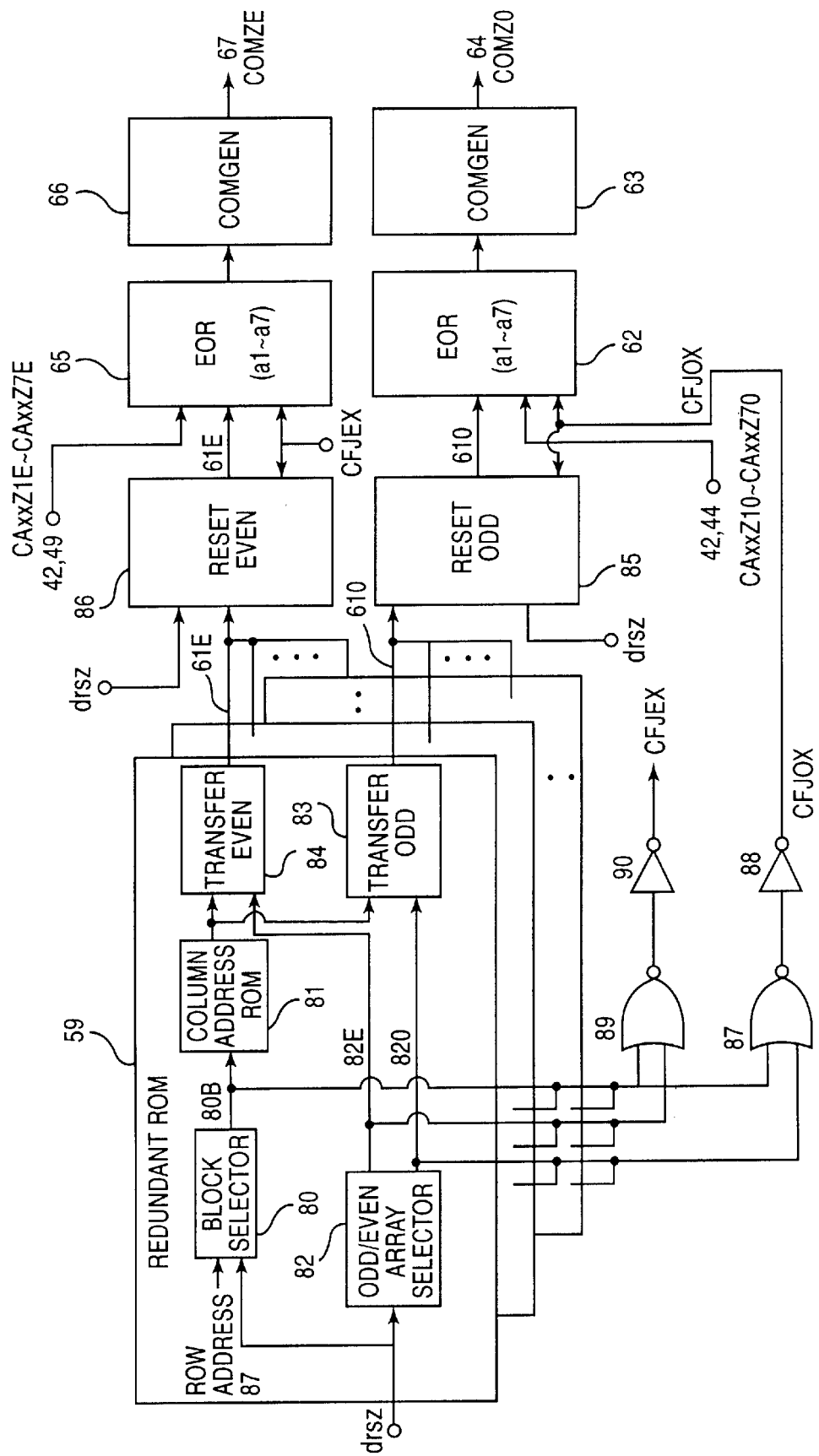
FIG. 5 is a block diagram depicting the overall configurations of each of the blocks shown in FIG. 4.

FIG. 4 depicts the overall architecture of the redundant circuitry of the first embodiment. FIG. 4 also depicts circuitry configurations in detail, but the circuits are drawn so small, it is hard to comprehend them. An overview of this architecture is provided here, and individual circuit configurations are explained below. FIG. 5 is a block diagram depicting the overall configurations of each of the blocks shown in FIG. 4. Suitable references to FIG. 5 should make the following explanation of FIG. 4 easier to understand.

Inside redundant ROM 59, the column address of a defective cell is stored in a redundant column address ROM 81 as a redundant address. Since redundant ROM 59 is common to an odd cell array and an even cell array, an odd/even array selector 82 is provided to store information as to whether a redundant address stored in redundant column address ROM 81 is an odd redundant address or an even redundant address. Furthermore, in the examples depicted in FIGS. 4 and 5, when the cell arrays are divided into a plurality of blocks, a block selector 80 is also provided to store the block of the redundant address stored in redundant column address ROM 81. The block selector 80 is supplied with a row address signal 87, and it determines whether or not this row address signal matches up with the address of the block being stored. When a match is achieved, block selection signal 80B is set to the active state and makes the redundant address stored in redundant column address ROM 81 output.

The odd/even array selector 82 responds to an activation signal drsz, and sets either an odd selection signal 82O or an even selection signal 82E to H level. In response to this selection signal 82O, 82E, transfer circuits 83, 84 respectively output a redundant address stored in redundant column address ROM 81, as either odd redundant addresses 61O or even redundant addresses 61E.

Redundant ROM 59 comprises a plurality of redundant column address ROM 81 (eight in the example depicted in FIG. 4), and stores the address of a block associated with a redundant address stored therein in a block selector 80, and stores related odd/even information in an odd/even array selector 82. Therefore, of the redundant addresses 61 outputted from a plurality of redundant column address ROM 81, only one set of redundant addresses 61O are outputted to the odd side, and only one set of redundant addresses 61E are outputted to the even side, respectively, as valid redundant addresses. Therefore, odd redundant addresses 61O are supplied by a wired OR circuit, for example, to a redundant address comparator 62 via an odd reset circuit 85, and even redundant addresses 61E are supplied by a wired OR circuit to a redundant address comparator 65 via an even reset circuit 86. These reset circuits 85, 86 are each supplied with the above-mentioned activation signal drsz, and when inactive, redundant addresses 61O, 61E are each forcibly driven to an H level reset state. This is a required reset for a wired OR circuit.

Redundant addresses 61O, 61E are each supplied to redundant address comparators (EOR circuits) 62, 65 via reset circuits 85, 86. Furthermore, redundant address validation signals CFJOX and CFJEX, which indicate whether the supplied redundant addresses 61O, 61E are valid or not, are supplied respectively to the redundant address comparators 62, 65. Then, the redundant address comparators 62, 65 are supplied respectively with column addresses 42, 44 and 42, 49, which are to be accessed. Therefore, when the redundant address validation signal with valid state is supplied to the redundant address comparators 62, 65, these comparators compare the redundant addresses 61O, 61E with the column addresses being accessed. The redundant address validation signals CFJOX and CFJEX are generated by a circuit comprising NOR circuits 87, 89 and inverters 88, 90, which process the block selection signal 80B, and an odd selection signal 82O or an even selection signal 82E. Here as well, the block selection signal 80B and odd selection signal 82O or even selection signal 82E are, for example, connected to a wired OR.

Furthermore, the outputs of the redundant address comparators 62, 65 are respectively supplied to redundant column selectors 63, 66, from which redundant column selection signals 64, 67 are generated.

Figure 6:
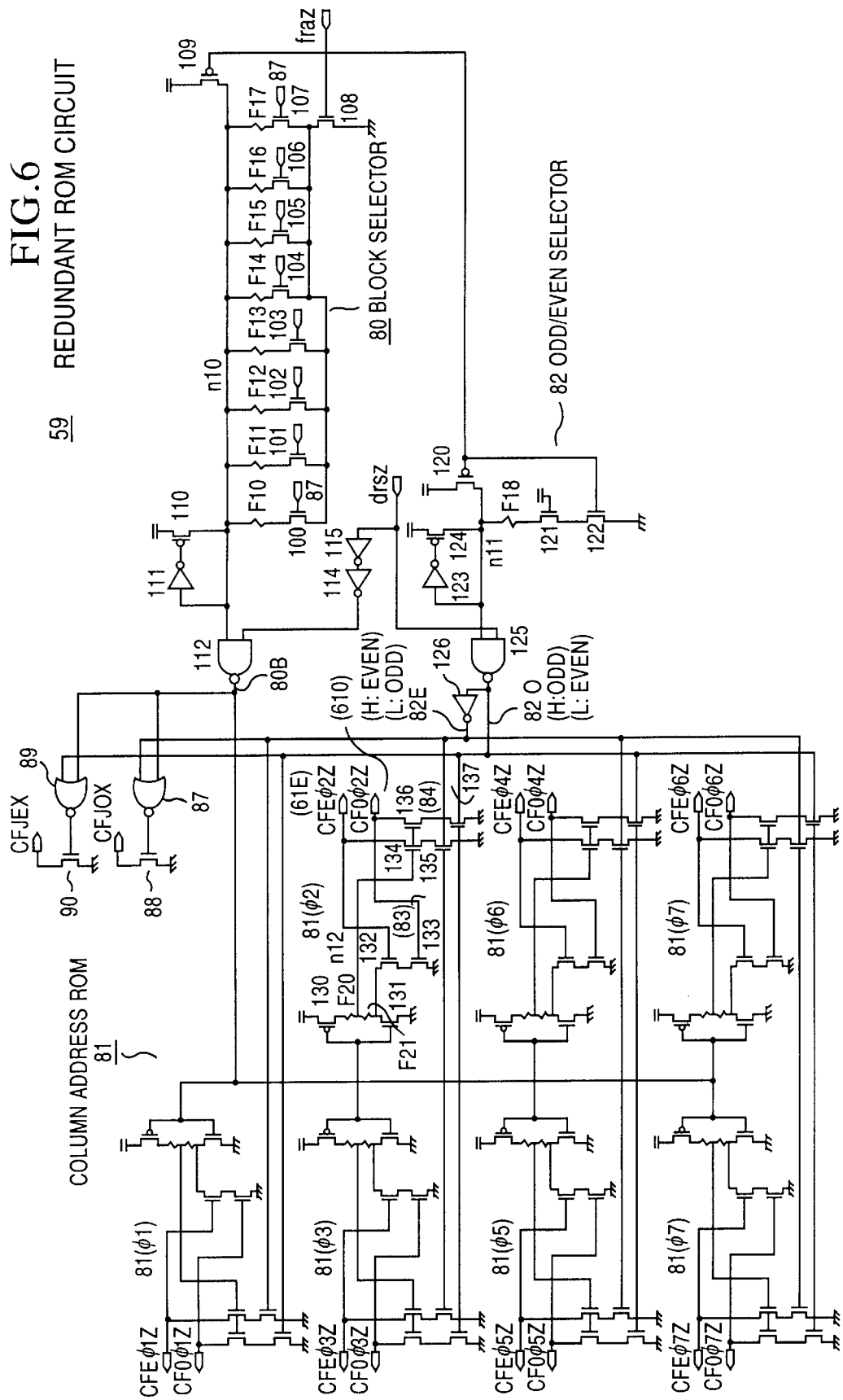
FIG. 6 depicts the detailed circuitry of a redundant ROM 59.

FIG. 6 depicts the detailed circuitry of a redundant ROM 59. A block selector 80 stores a row address of a block corresponding to a stored redundant address in a fuse F10–F17. Then, accessed row address signals 87 are supplied to an N-type transistor 100–107 connected in series to these fuses F10–F17. A node n10 is reset to H level via a P-type transistor 109 by an L level control signal fraz. An N-type transistor 108 is nonconductive at this time. Thus, when the accessed row address 87 is supplied, and the control signal fraz transitions to H level and enters an active state, transistor 108 conducts, and when all row addresses match, the node n10 is held at H level, and the block selection signal 80B is driven to L level. If even one address does not match, the node n10 is driven to L level. As a result, the block selection signal 80B is set to H level. When the node n10 is held at H level, an inverter 111 and a P-type transistor 110 prevent the node n10 from becoming a floating state.

Further, the odd/even array selector 82 is configured similar to the block selector 80. That is, information as to whether a redundant address stored in the redundant column address ROM 81 is odd or even is stored in a fuse F18. This circuit example shows that when the fuse F18 is in a conductive state, an odd redundant address is stored, and when the fuse F18 is cut OFF and is in a nonconductive state, an even redundant address is stored. With this odd/even array selector 82 as well, an L level control signal fraz makes an N-type transistor 122 nonconductive, a P-type transistor 120 conductive, and resets a node n11 to H level. Then, when the control signal fraz assumes an H level active state, transistor 122 conducts, and node n11 is driven to L level or H level depending on whether fuse F18 is in a conductive or nonconductive state. Then, in response to an H level activation signal drsz, a NAND gate 125 either drives an odd selection signal 82O to H level (selects odd), or, via an inverter 126, drives an even selection signal 82E to H level (selects even).

This odd selection signal 82O, even selection signal 82E and block selection signal 80B are supplied, respectively, to a NOR gate 87, 89, and redundant address validation signals CFJOX, CFJEX are generated by inverters comprising N-type transistors 88, 90. When odd is selected, the L level of the block selection signal 80B and the L level of the even selection signal 82E drive the output of a NOR gate 87 to H level, and the odd r redundant address validation signal CFJOX to L level. Conversely, when even is selected, the L level of the block selection signal 80B and the L level of the odd selection signal 82E drive the output of a NOR gate 89 to H level, and the even redundant address validation signal CFJEX to L level.

A redundant column address ROM 81 stores a redundant column address a1–a7. This redundant column address a1–a7 is an 8-bit column address minus the least significant bit. FIG. 6 depicts ROM 81(01)–81(07), in which this 7-bit column address is stored. Since these circuits are all the same, ROM 81(02), which stores column address a2, is used as a typical example to explain this circuit.

In ROM 81(02), which stores column address a2, a fuse F20, which stores column address a2, is provided between a P-type transistor 130 and an N-type transistor 131. A fuse F21 is simply provided opposite fuse F20, and serves to adjust the output level of this inverter. A block selection signal 80B is s supplied to the gate of these transistors 130, 131. The H level of the block selection signal 80B resets a node n12 to L level. Following that, when there is a matching row address, the L level of the block selection signal 80B causes the P-type transistor 130 to conduct, and either holds the node n12 at L level or drives it to H level, depending on the memory state (conductive or nonconductive) of fuse F20. The signal of this node n12 is distributed to an even redundant address comparator or an odd redundant address comparator, respectively, by N-type transistors 134, 135 and N-type transistors 136, 137, which comprise transfer circuits 83, 84.

An even selection signal 82E and an odd selection signal 82O are supplied to N-type transistors 135, 137, which are connected to the ground sides of transfer circuits 83, 84. That is, since the H levels of the selection signals 82E, 82O cause the transistors 135, 137 to conduct, N-type transistors 134, 136, which are controlled in accordance with the level of the node n12 corresponding thereto, cause the stored redundant address to be outputted as either CFE02Z (61E) or CFO02Z (61O).

The other redundant column address ROM 81 are configured the same way, each is provided with a transfer circuit, and redundant address CFO01Z–CFO07Z (61O) or redundant address CFE01Z–CFE07Z (61E), respectively, are outputted.

The above-mentioned redundant addresses CFO01Z–CFO07Z (61O), CFE01Z–CFE07Z (61E) are outputted from a plurality of redundant ROM 59, and supplied to reset circuits 85, 86 connected by wired OR architectures. Since the above-mention transfer circuits 83, 84 are the wired OR connections, and since they cannot be driven to H level, this reset circuit 85, 86 is provided, and at reset, resets all redundant addresses CFO01Z–CFO07Z (61O), CFE01Z–CFE07Z (61E) to H level. Or, the reset circuit 85, 86 controls the H level state of a valid redundant address when it is active so that it does not exhibit floating. Furthermore, the reset state of the reset circuit 85, 86 is released by redundant address validation signals CFJOX, CFJEX only for a valid redundant address.

Figure 7:
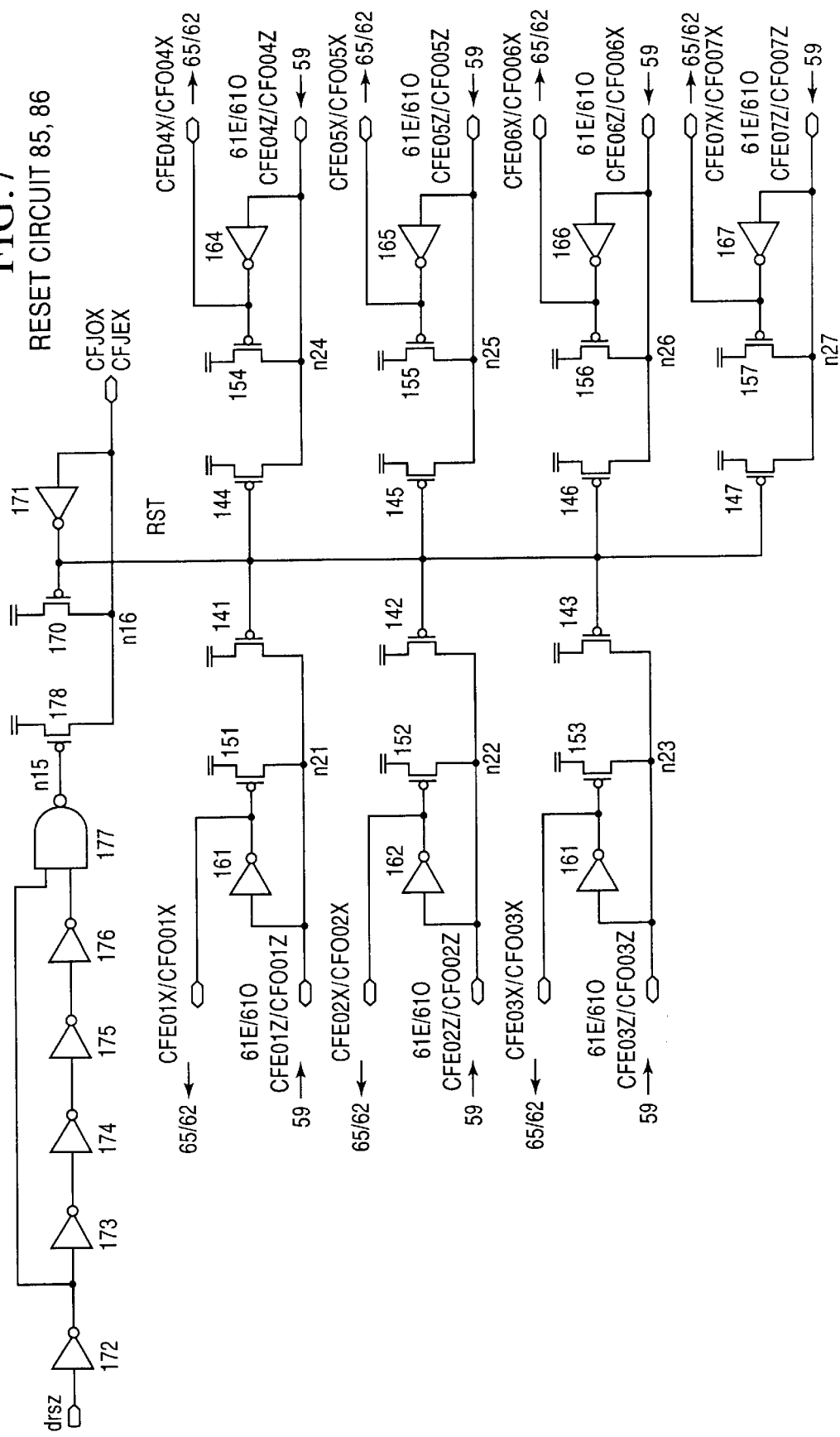
FIG. 7 depicts a detailed diagram of a reset circuit 85, 86.

FIG. 7 depicts a detailed diagram of a reset circuit 85, 86. As depicted in FIGS. 4 and 5, in the first embodiment this reset circuit 85, 86 is provided for odd and even redundant addresses 61O, 61E, respectively. This reset circuit comprises a function for forcibly resetting redundant address signals 61O, 61E from a redundant ROM 59 to H level at reset, a function for releasing a reset state when a redundant address signal is valid, and a function for preventing active, H level redundant address signals 61O, 61E from becoming a floating state.

P-type transistors 141–147 are reset transistors. These transistors are in the reset state when an activation signal drsz is L level, but in response to an L level activation signal drsz, a signal, which is temporarily L level, is generated from inverters 172–176 and NAND gate 177 to a node n15, and this signal causes a P-type transistor 178 to conduct, driving a node n16 temporarily to H level. The signal of this node n16 is inverted by an inverter 171, and a temporarily L level reset signal RST is generated. The temporary L level of the reset signal RST causes all the reset transistors 141–147 to conduct, forcibly driving nodes n21–n27 to H level. As a result, wired OR-connected redundant address signals 61O, 61E are all reset to H level.

Nodes n21–n27 are connected by redundant address signals 61E, 61O and wired OR connections from a plurality of redundant ROM 59. Therefore, the conduction of the above-mention reset transistors 141–147 resets these commonly connected nodes n21–n27 to H level. And resetting node n16 to H level for similarly wired OR-connected odd and even redundant address validation signals CFJOX, CFJEX resets redundant address validation signals CFJOX, CFJEX from all redundant ROM 59 to H level.

Next, for a separate function of a reset circuit, transistors 151–157 and inverters 161–167, which prevent nodes n21–n27 from becoming an H level floating state, are provided for each redundant address. Redundant addresses 61E, 61O from redundant ROM 59 are supplied to the inverters 161–167. Then, when an odd/even redundant address validation signal CFJOX, CFJEX becomes a valid state L level, reset is released, the reset signal RST becomes H level, and all reset transistors 141–147 become nonconductive. As a result, nodes n21–n27, to which an H level floating state redundant signal 61E, 61O is applied, are securely connected to a power source Vcc by the conduction of P-type transistors 151–157, and avoid a floating state. CFE01Z/CFO01Z–CFE07Z/CFO07Z of redundant addresses 61E, 61O are inverted by inverters 161–167 and supplied to a redundant address comparator 65, 62 as an H-level active redundant address CFE01X/CFO01X.

Figure 8:
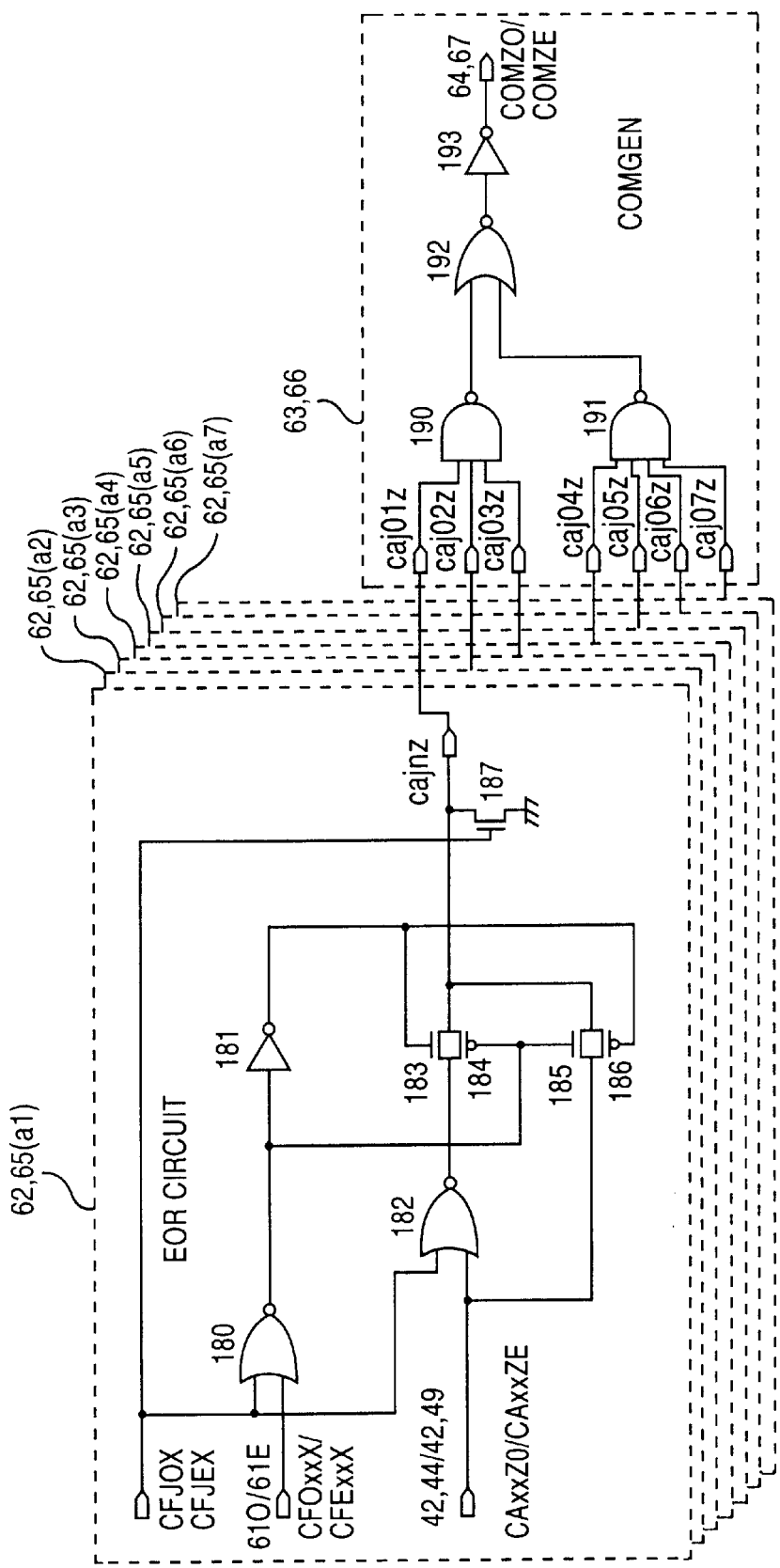
FIG. 8 depicts diagrams of a redundant address comparator and redundant column selector of the first embodiment.

FIG. 8 depicts diagrams of a redundant address comparator and redundant column selector of the first embodiment. In the first embodiment, only a redundant ROM 59 is common to the odd and even sides, a redundant address comparator 62, 65 is provided for the odd and even sides, respectively, and compare all the column addresses thereof. Therefore, as shown in the figure, the redundant address comparators 62, 65 are provided in parallel, corresponding to column addresses a1–a7.

FIG. 8 depicts the circuit architecture of a redundant address comparator for a column address a1. When a redundant address validation signal CFJOX, CFJEX is an invalid H level, a redundant address 61O, 61E is invalid, which means that the conduction of transistor 187 drives the total output cajnz of a redundant comparator 62, 65 to L level. Therefore, the input of a redundant column selector 63, 66 is all L level, and its output 64, 67 is non-selective H level.

Meanwhile, when a redundant address validation signal CFJOX, CFJEX is a valid L level, transistor 187 is nonconductive, and NOR gates 180, 182 are in the through state. Therefore, CMOS switches 183, 184 or 185, 186 conduct according to the H level or L level of a redundant address 61O, 61E. Therefore, in accordance with this, accessed column address 42, 44 or 42, 49 either passes through or does not pass through a NOR gate 182, and either the inverted signal or the non-inverted signal thereof is outputted. This is the exclusive or function of the redundant address 61O, 61E and the accessed column address 42, 44/42, 49.

FIG. 9 is a table depicting the relationship between a redundant address 61O, 61E and an accessed address 42, 44, 42, 49. As depicted herein, if the two addresses are assumed to match when a logically exclusive relationship exists, and not to match when they are logically the same, then the output of a redundant address comparator 62, 65 is H level when there is a match, and L level when there is no match.

Therefore, when there are matches for all column addresses a1–a7, the outputs caj01z–caj07z of a redundant column selector 63, 66 are all H level, and the outputs of NAND gates 190 and 191 are L level. As a result, NOR gate 192 output is H level, and inverter 193 output is L level. Redundant column selector 64, 67 is L level and in a selective state. NAND gates 190, 191 and NOR gate 192 may also be configured as a single NAND gate.

Second Embodiment

In the above-described first embodiment, a block selector 80, which stores a block address, and an odd/even array selector 82, which stores odd and even information, are provided together with a redundant column address ROM 81 inside a redundant ROM 59. Then, the redundant addresses thereof are distributed by a transfer circuit 83, 84 over a redundant address signal 61O line to an odd redundant address comparator, and over a redundant address signal 61E line to an even redundant address comparator.

However, by distributing redundant address signals over odd lines and even lines, respectively, the number of those lines increases, adversely influencing integration. In addition, by distributing redundant address signals over odd lines and even lines, respectively, it is necessary to provide a reset circuit 85, 86 for each line, a factor which also adversely influences integration.

Meanwhile, a block selector 80 inside a redundant ROM 59 compares a row address against a stored block address. The row address is input during row address strobe (RAS), and thereafter, for example, after 20nsec, a column address is input during column address strobe (CAS).

Accordingly, in the second embodiment, a terminal that outputs a redundant address from a redundant ROM is common to the odd side and the even side, and after a row address has been inputted, an odd redundant address and an even redundant address are supplied on a time-sharing basis to respective redundant address comparators. A latch circuit, which stores an odd redundant address, is provided for an initially-supplied odd redundant address comparator. This embodiment can also be applied to a memory with a 4-bit or larger pre-fetch architecture.

FIG. 10 depicts a block diagram of the second embodiment. Parts that are the same as those depicted in FIG. 2 are assigned the same reference numbers. In this example as well, an odd redundant address and an even redundant address are flexibly stored in a redundant ROM 59 common to a plurality of memory blocks. The terminal for redundant address signals 61 from redundant ROM is used in common for both the odd and even sides. Then, to supply this redundant address signal 61 on a time-sharing basis to an odd redundant address comparator 62 and an even redundant address comparator 65, a latch circuit 200, which stores a redundant address, is provided adjacent to an odd redundant address comparator 62. Beyond that, the configuration is identical to that depicted in FIG. 2.

Figure 11:
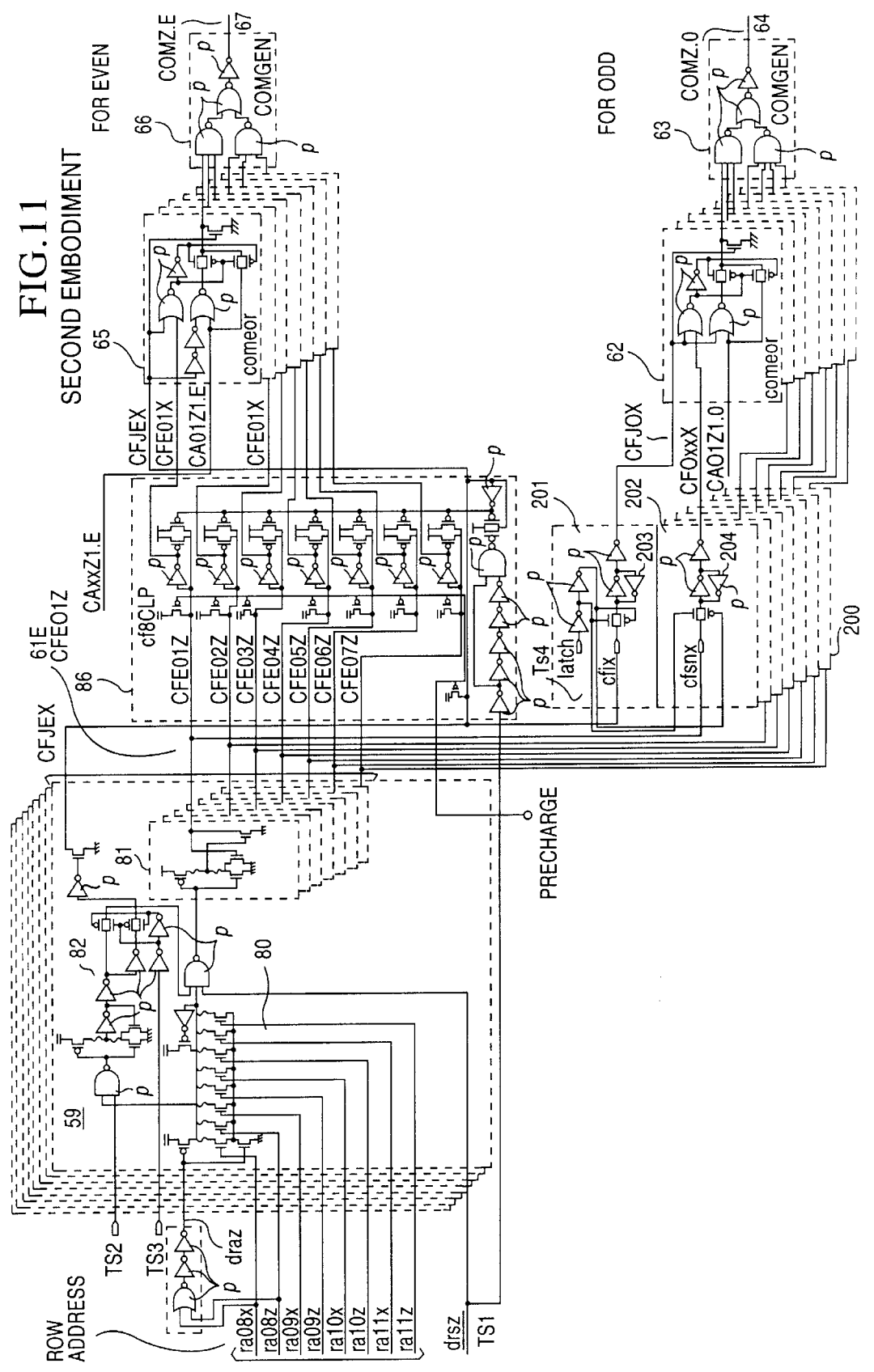

FIG. 11 depicts the entire architecture of the redundant circuitry of the second embodiment. The overall configuration of a redundant circuitry is depicted in FIG. 11, but because the individual circuit configurations are so small, these circuit configurations are explained separately below.

As shown in FIG. 11, similar to the first embodiment, a redundant column address ROM 81, which stores a redundant address, a block selector 80, which stores an address of a memory block, to which this redundant address belongs, and an odd/even array selector 82, which stores information as to whether or not this redundant address is odd or even, are provided inside a redundant ROM 59. Then, when the block selector 80 matches a block select address, a redundant address from the redundant column address ROM 81 is outputted over a common redundant address signal line 61. Furthermore, redundant address signal lines 61 and redundant address validation signal CFJX lines from a plurality of redundant ROM 59 are wired OR connected.

In this redundant circuitry, while a timing signal TS3 is at L level, an odd redundant address selected by an odd/even array selector 82 is effectively outputted to a redundant address signal line 61, following which, after the timing signal TS3 transitions to H level, an even redundant address selected by an odd/even array selector 82 is effectively outputted to the redundant address signal line 61. The odd redundant address signal initially outputted to the redundant address signal line 61, together with a redundant address validation signal CFJX, are latched to respective latch circuits 203, 204 in a latch circuit 200, and supplied to an odd redundant address comparator 62. Conversely, the even redundant address signal subsequently outputted to the redundant address signal line 61 is supplied to an even redundant address comparator 65, together with a redundant address validation signal CFJX. Whereas the circuitry 201 that latches a redundant address validation signal latches one bit at a time, the circuitry 202 that latches an odd redundant address comprises a 7-bit latch circuit.

Furthermore, in this redundant circuitry, in line with the shared use of the redundant address signal line 61, a reset circuit 86 is also shared in common. Therefore, when a timing signal TS3 transitions from L level to H level, to reset an odd redundant address signal from the signal line 61, a reset circuit 86 performs a reset operation one time. Consequently, as shown in FIG. 11, a precharge signal "Precharge" precharges the redundant address signal line 61 to H level.

Figure 12:
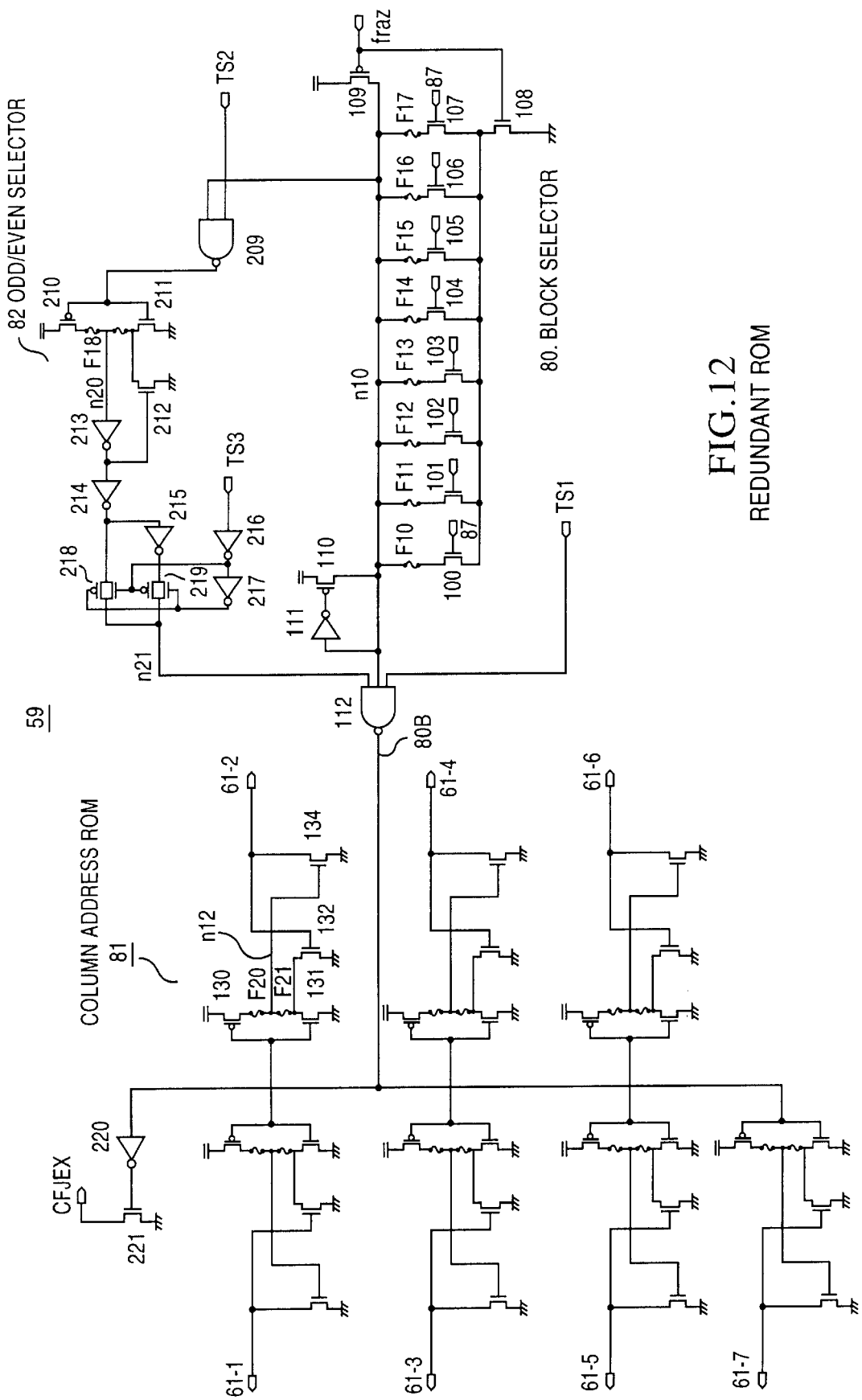
FIG. 12 depicts the detailed circuitry of the redundant ROM 59 depicted in FIG. 11.

FIG. 12 depicts the detailed circuitry of the redundant ROM 59 depicted in FIG. 11. And FIG. 13 depicts the detailed circuitry of the redundant address comparators 62, 65, latch circuit 200 and redundant column selectors 66, 63 depicted in FIG. 11. Then, FIG. 14 depicts an operational timing chart of these redundant circuits.

The redundant ROM architecture depicted in FIG. 12 is identical to the redundant ROM of the first embodiment depicted in FIG. 6 in that it comprises a block selector 80, an odd/even array selector 82, and a redundant column address ROM 81. In the block selector 80, an row address in the process of being accessed is supplied to a gate 87 of transistors 100–107. The block selector 80 also stores the row address of a block that corresponds to a redundant column address stored in fuses F10–f17. This circuit architecture is practically the same as that depicted in FIG. 6. The odd/even array selector 82 stores in fuse F18 information corresponding to whether a redundant address is odd or even. This example indicates that when fuse F18 is in a conductive state, an odd redundant address is stored, and when it is in a nonconductive state, an even redundant address is stored. This odd or even information is read out to a node n21 on a time-sharing basis when timing signal TS3 is H level and L level.

When a block address matches a row address in a block selector 80, and the odd/even array selector 82 is storing odd information when the timing signal TS3 is L level, or when the odd/even array selector 82 is storing even information when the timing signal TS3 is H level, the output 80B of NAND gate 112 is L level. As a result, redundant address signals inside redundant column address ROM 81 are outputted by each output terminal 61-1~1-7. Simultaneously, a redundant address validation signal CFJX also becomes L level, a valid state level, by virtue of inverter 220 and transistor 221. In this embodiment, output from redundant column address ROM 81 is generated to the odd or even side by common output terminals 61-1~61-7. Therefore, transfer circuits as depicted in FIG. 6 are not provided.

Figure 14:
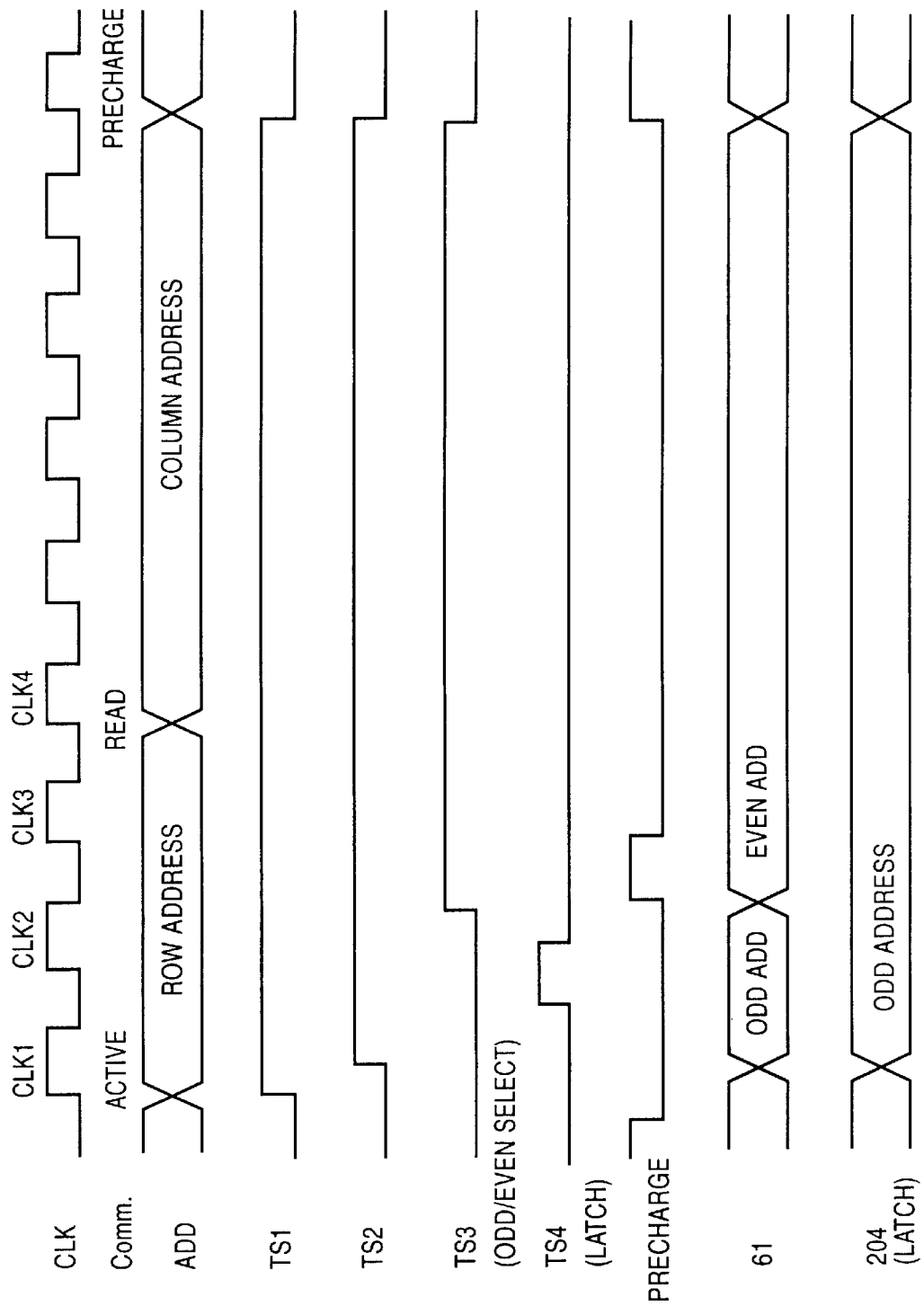
FIG. 14 depicts an operational timing chart of these redundant circuits.

The following explanation is based on the timing chart depicted in FIG. 14. An active command is applied based on clock CLK timing, and a row address is supplied to an address terminal. At this time, redundant ROM 59 is activated based on timing signal TS1, and reset by a reset circuit 86. While a control signal fraz is L level, a node n10 in the block selector 80 is reset to H level, and the input of the row address transitions the control signal fraz to H level, transistor 108 conducts, and the row address is compared against fuses F10–F17. When these match, the node n10 is held at H level, and when they do not match, the node n10 transitions to L level. Accordingly, in a redundant ROM, wherein a block address matched, the rise of timing signal TS2 causes NAND gate 209 output to become L level and transistor 210 in the odd/even selector 82 to conduct. Therefore, node n20 becomes either H level or L level depending on whether fuse F18 is conductive (odd) or nonconductive (even).

Thereafter, while timing signal TS3 is L level, in a redundant ROM, wherein odd information is stored by the conduction of fuse F18, an H level is outputted to node n21 via a transfer gate 218. As a result, an enable signal 80B of that redundant ROM becomes L level. The following describes the output of redundant address terminal 61-2 in redundant column address ROM 81. A redundant address is stored according to whether fuse F20 is nonconductive or conductive. The L level of an enable signal 80B either sets node n12 to H level (fuse F20 conducts) or holds node n12 at L level (fuse F20 does not conduct), and this makes N-type transistor 134 either conductive or nonconductive, causing redundant address terminal 61-2 to become either L level or H level. This signal is an odd redundant address signal, and a redundant address validation signal CFJX and the odd redundant address are latched by the H level pulse of timing signal TS4 to a latch circuit 201, 202 provided in front of the odd redundant address comparator 62. That is, based on timing signal TS4, transfer gate 234 conducts and a redundant address validation signal CFJX is latched to latch circuit 203, and transfer gate 237 conducts and a redundant address 61 is latched to latch circuit 204. See FIG. 13.

Thereafter, a precharge operation is performed by a precharge circuit 86, and timing signal TS3 transitions to H level. In line with this, a transfer gate 219 of an odd/even array selector 82 inside redundant ROM 59 (see FIG. 12) conducts, and an inverted signal from a node n20 is outputted to a node n21. Therefore, in a redundant ROM 59, wherein even information is stored as a result of the nonconductive state of fuse F18, node n21 becomes H level. Therefore, in a redundant ROM, wherein a block address matches and even information is stored, an enable signal 80B becomes L level, and a redundant address stored in a redundant column address ROM 81 is outputted by redundant address terminals 61-1~61-7.

At this point, since timing signal TS4 is L level, transfer gates 234, 237 inside a latch circuit 200 are closed. Therefore, this redundant address 61 is only supplied to an even redundant address comparator 65. In this way, a valid odd redundant address is applied to an odd redundant address comparator 62, and a valid even redundant address is applied to an even redundant address comparator 65, respectively.

The redundant address comparators 62, 65 depicted in FIG. 13 are the same as the circuits depicted in FIG. 8. In FIG. 13, a latch circuit 201, which latches a redundant address validation signal CFJX, and a latch circuit 202, which latches a redundant address 61, are provided in front of an odd redundant address comparator 62.

As described above, in this embodiment, since odd and even redundant addresses are flexibly stored in a redundant ROM for a plurality of blocks, it is possible to reduce the capacity of the redundant ROM and still relief defective cells with reasonable probability. Moreover, because the redundant address output terminals from redundant ROM are used in common for both the odd and even sides, and both redundant signals can be applied on a time-sharing basis, the circuit architecture of redundant ROM can be simplified, and the number of redundant address output terminals can be reduced. This embodiment can also be applied to memory with 4-bit and larger pre-fetch architectures.

Third Embodiment

Figure 15:
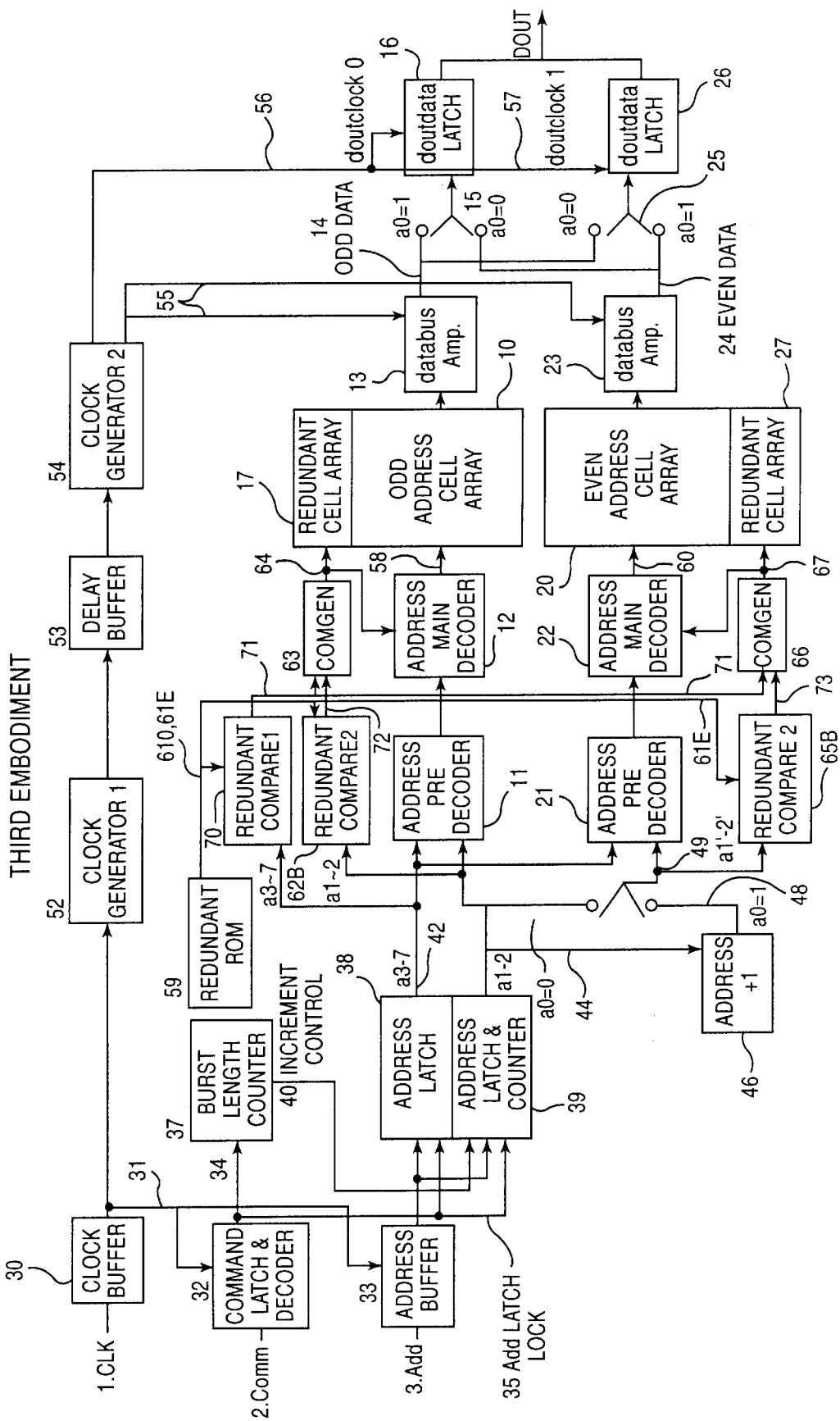
FIG. 15 depicts a block diagram of a third embodiment of the present invention.

FIG. 15 depicts a block diagram of a third embodiment of the present invention. Parts that are the same as those depicted in FIG. 2 are assigned the same reference numbers. In this example, similar to the first and second embodiments described above, a redundant cell array 17 is provided for an odd address cell array 10, and a redundant cell array 27 is provided for an even address cell array 20. Then, a common redundant ROM 59 flexibly stores column addresses of defective cell arrays in both cell arrays 10, 20.

In the third embodiment, a redundant address comparator further comprises an upper redundant address comparator 70, which, with regard to an upper column address a3–a7, compares an address being accessed 42 with a redundant address 61, and an odd lower redundant address comparator 62B and an even lower redundant address comparator 65B for a lower column address a1, a2. The upper redundant address comparator 70 is provided in common for the odd and even sides, and a comparative signal 71 outputted therefrom is applied to an odd redundant column selector 63 and an even redundant column selector 66. In the odd lower redundant address comparator 62B, a lower column address (a1, a2) 44 being accessed is compared with a redundant address 61, and a comparative signal 72 outputted therefrom is applied to an odd redundant column selector 63. Further, in the even lower redundant address comparator 65B, either a lower column address (a1, a2) 44, or a shifted address (a1', a2') 49 is compared with a redundant address 61, and a comparative signal 73 outputted therefrom is applied to an even redundant column selector 66.

A 2-bit pre-fetch circuit architecture comprises an odd address cell array and an even address cell array, and since the upper address a3–a7 is always the same for both cell arrays, the comparison of this upper address a3–a7 to a redundant address 61 is performed by an upper redundant address comparator 70 that is common to both cell arrays. Compared to past approaches, this third embodiment makes it possible to dispense with a 5-bit comparator for an upper column address a3–a7. The effects of this will become greater as the number of column addresses increase in line with further increases in memory capacity.

Figure 16:
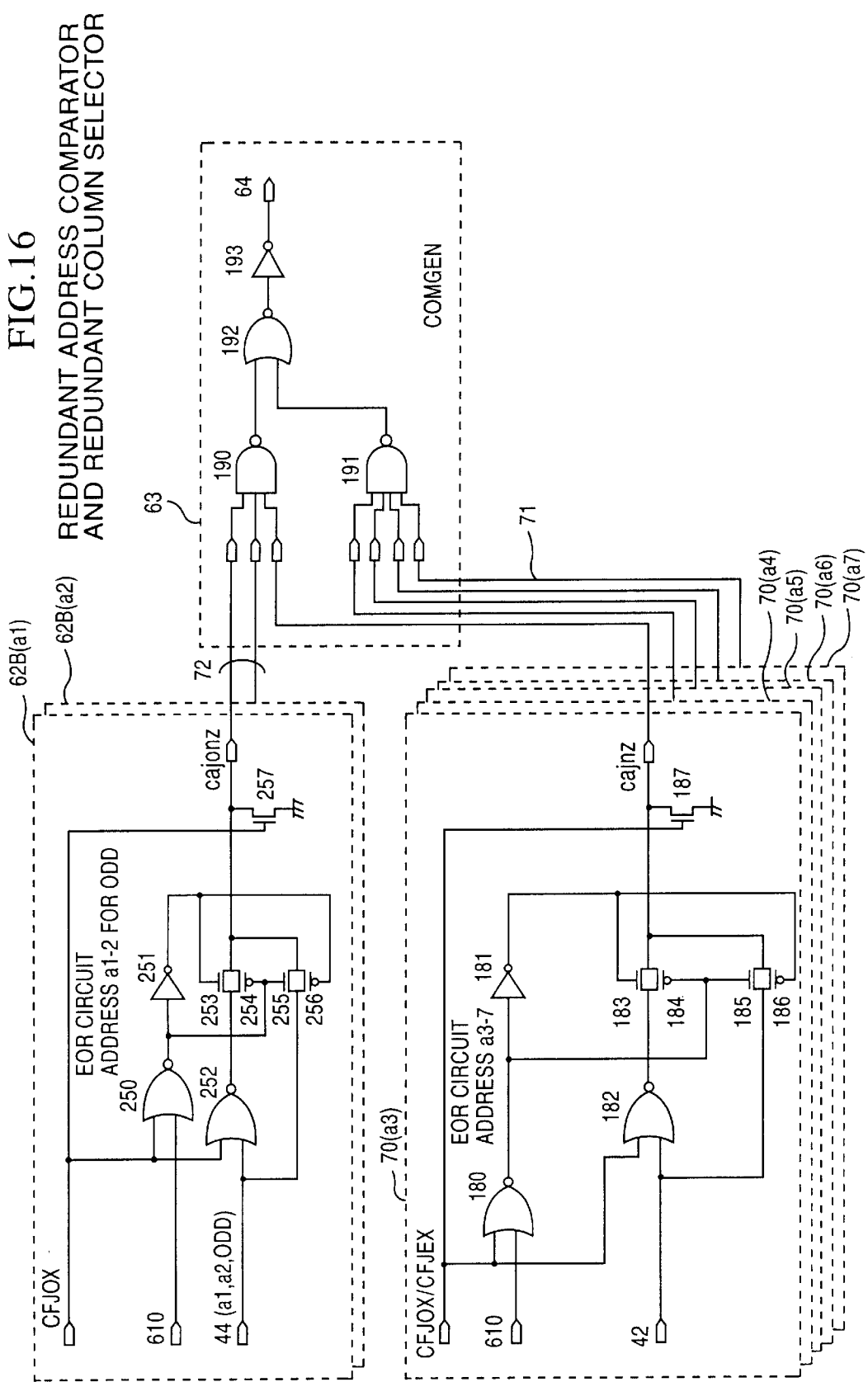
FIG. 16 depicts circuit diagrams of a redundant address comparator and a redundant column selector of the third embodiment.

FIG. 16 depicts circuit diagrams of a redundant address comparator and a redundant column selector of the third embodiment. The block diagram in FIG. 15 depicts a common redundant ROM 59, a common upper redundant address comparator 70, respective lower redundant address comparators 62B, 65B and respective redundant column selectors 63, 66, but FIG. 16 depicts only a common upper redundant address comparator 70, an odd lower redundant address comparator 62B and an odd redundant column selector 63.

Firstly, the common upper redundant address comparator 70 compares the 5-bit address of an address signal a3–a7. Therefore, the architecture of this circuit is identical to that of the redundant address comparator depicted in FIG. 8. The five outputs 71 of an upper redundant address comparator 70 are supplied to NAND gates 190 and 191 inside an odd redundant column selector 63.

The architecture of an odd redundant column selector 63 is identical to a circuit depicted in FIG. 8. That is, it comprises NAND gates 190, 191, a NOR gate 192 and an inverter 193.

The circuit architecture of a lower redundant column address comparator 62B provided separately is identical to that of an upper redundant address comparator 70. An odd lower redundant column address selector 62B comprises a NOR gate 250, which passes a redundant address 61O based on a redundant address validation signal CFJOX, an inverter 251, which serves as NOR gate output, a NOR gate 252, which passes a column address a1, a2 (44) to be accessed, CMOS switching transistors 253–256, and a reset transistor 257. Output therefrom is then applied to a NAND gate 190 in an odd redundant column selector 63. When output 71 from an upper redundant address comparator 70 is all H level, and output 72 from a lower redundant address comparator 62B is all H level, the outputs of NAND gates 190, 191 is L level, the output of NOR gate 192 is H level, and the output of inverter 193 is L level. Therefore, a redundant cell array is selected based on the L level of a redundant column selection signal 64, prohibiting the selection of a defective cell.

The architecture of an even lower redundant address comparator 65B is identical to the architecture of an odd lower redundant address comparator 62B depicted in FIG. 16. However, a column address to be accessed can change an address a1, a2 (44) or a shifted address a1', a2'(48) depending on whether the least significant address a0 is a=0 or a=1.

As described above, since the third embodiment makes possible a common upper redundant address comparator 70, the circuit architecture can be made smaller than conventional examples by the amount of the redundant address comparator 70 depicted in the figure. This embodiment can also be applied to a memory with a 4-bit or larger pre-fetch architecture.

Fourth Embodiment

Figure 17:
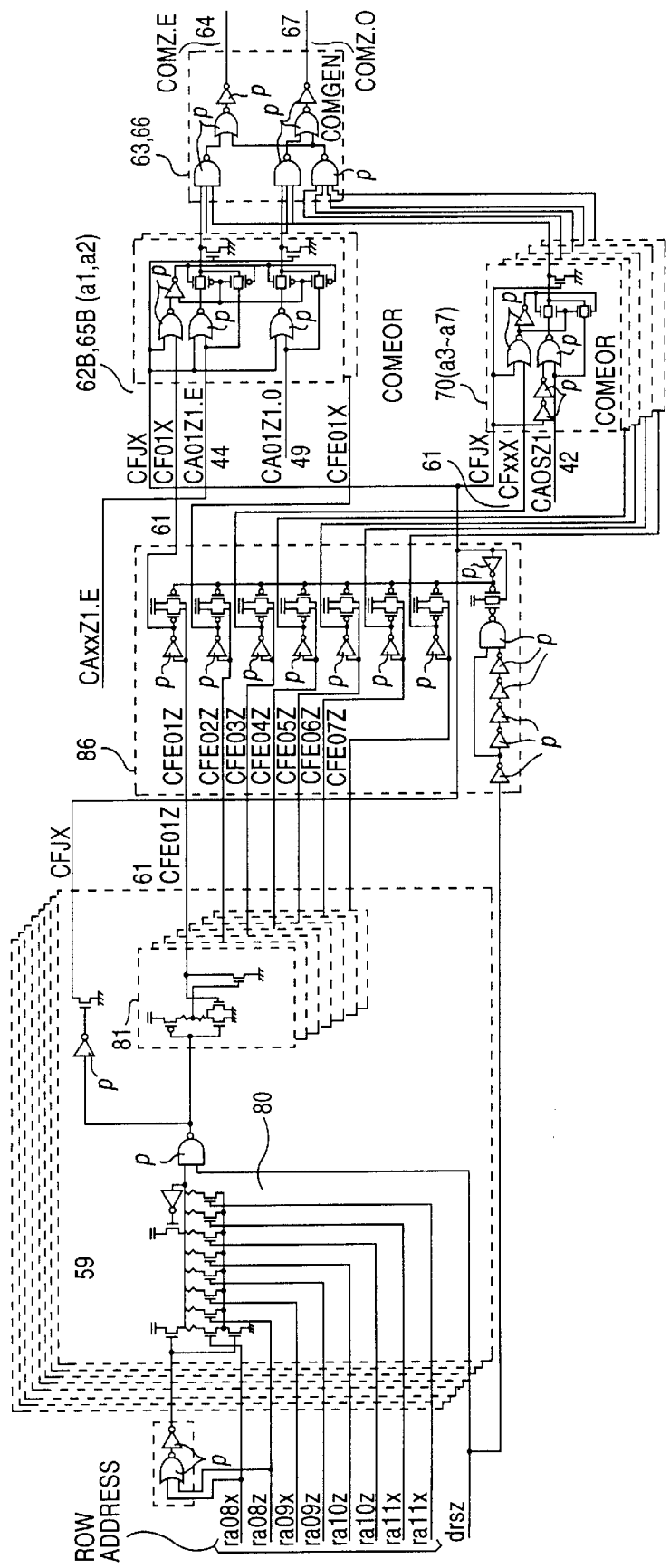
FIG. 17 depicts an entire architecture of a redundant circuitry of a fourth embodiment.

FIG. 17 depicts an entire architecture of a redundant circuitry of a fourth embodiment. This example is a modification of the above-described third embodiment. In this example, a redundant ROM 59 is not provided with an odd/even array selector. Therefore, a redundant address output terminal is used in common for the odd and even sides. That is, in this example, when a defective cell exists in either an odd address cell array or an even address cell array, both cell arrays can be substituted for simultaneously by a redundant cell array. That is, a redundant address is stored in a redundant column address ROM 81 without distinguishing between odd and even. Then, redundant addresses are stored in a redundant ROM 59 flexibly only for a plurality of memory cell blocks.

In the fourth embodiment, a redundant address comparator comprises a common upper redundant address comparator 70, which compares an upper address a3–a7 with a redundant address 61, and lower redundant address comparators 62B, 65B, which compare an odd and an even lower address a1, a2, respectively, with a redundant address 61. This is identical to the above-described third embodiment.

However, in the fourth embodiment, since a common redundant address 61 can be outputted to the odd and even sides from a redundant ROM 59 the same as a common redundant address validation signal CFJX, the lower redundant address comparators 62B, 65B can be configured in an integral fashion.

Figure 18:
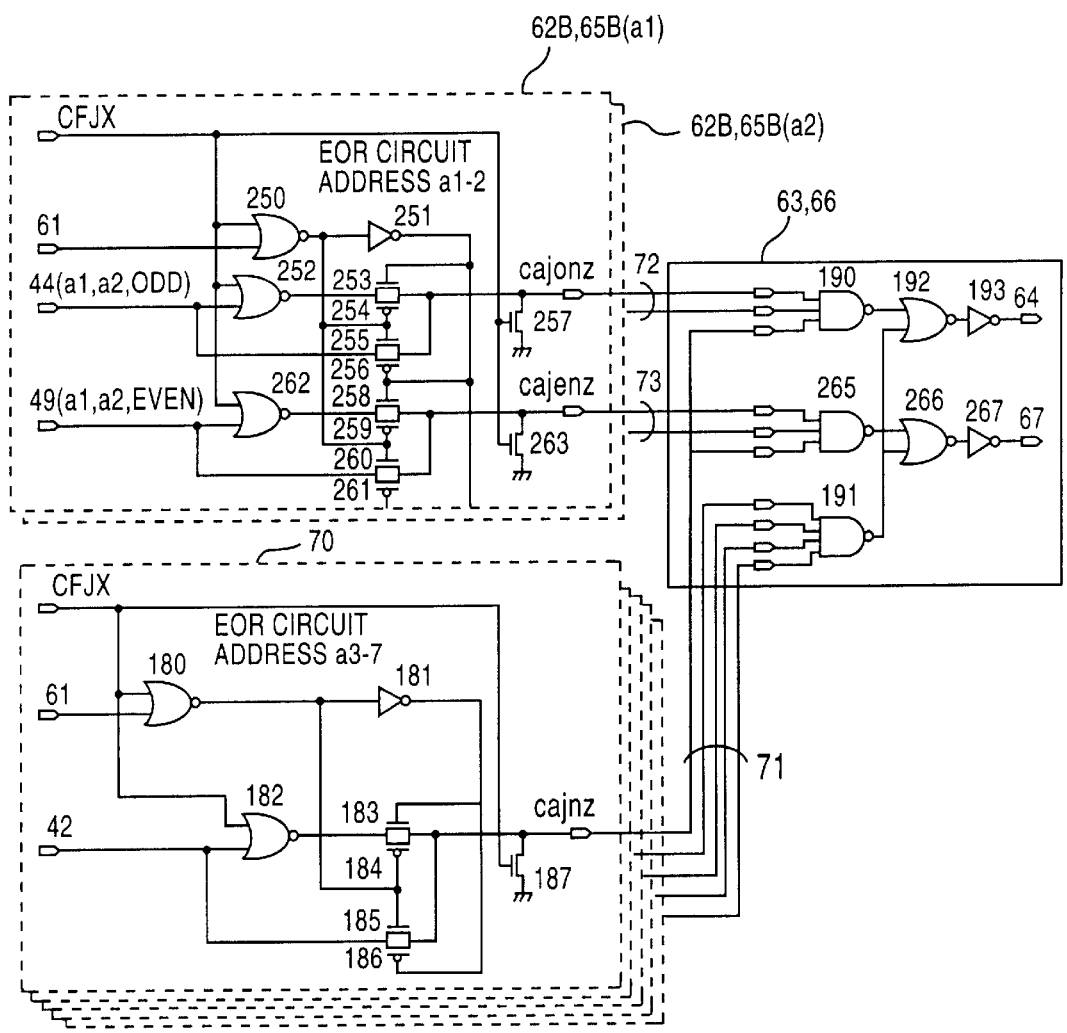
FIG. 18 depicts a detailed circuit diagram of a redundant address comparator and redundant column selector of the fourth embodiment.

FIG. 18 depicts a detailed circuit diagram of a redundant address comparator and redundant column selector of the fourth embodiment. In this example, the lower redundant address comparators 62B, 65B are integrated together. An upper redundant address comparator 70 has the same architecture as a circuit depicted in FIG. 16. In the lower redundant address comparators 62B, 65B, NOR gates 250, 252, 262 are set to a through state by an L level redundant address validation signal CFJX. Accordingly, the logic of a redundant address 61 makes either gates 253, 254 or gates 255, 256 conductive, and the inverted or non-inverted signal of an odd address 44 is outputted as output 72. And similarly, the logic of a redundant address 61 makes either gates 258, 259 or gates 260, 261 conductive, and the inverted or non-inverted signal of an even address 49 is outputted as output 73.

Output 71 of an upper redundant address comparator 70 and odd output 72 of lower redundant address comparators 62B, 65B are collected in NAND gates 190, 191, and when all output 71, 72 is H level, the respective NAND gates output L level, and H level is outputted by NOR gate 192. As a result, an odd redundant column selection signal 64 becomes L level (select state).

Similarly, output 71 of an upper redundant address comparator 70 and even output 73 of lower redundant address comparators 62B, 65B are collected in NAND gates 265, 191, and when all output 71, 73 is H level, the respective NAND gates output L level, and H level is outputted by NOR gate 266. As a result, an even redundant column selection signal 67 becomes L level (select state).

In this way, the circuit architecture of the fourth embodiment depicted in FIG. 18 is identical to the circuit architecture of the third embodiment depicted in FIG. 15. However, by simplifying the redundant ROM 59 architecture, and making a redundant address validation signal CFJX and a redundant address 61 common to an odd side and an even side, it is possible to make a lower redundant address comparator common in part to both an odd side and an even side.

Fifth Embodiment

Figure 19:
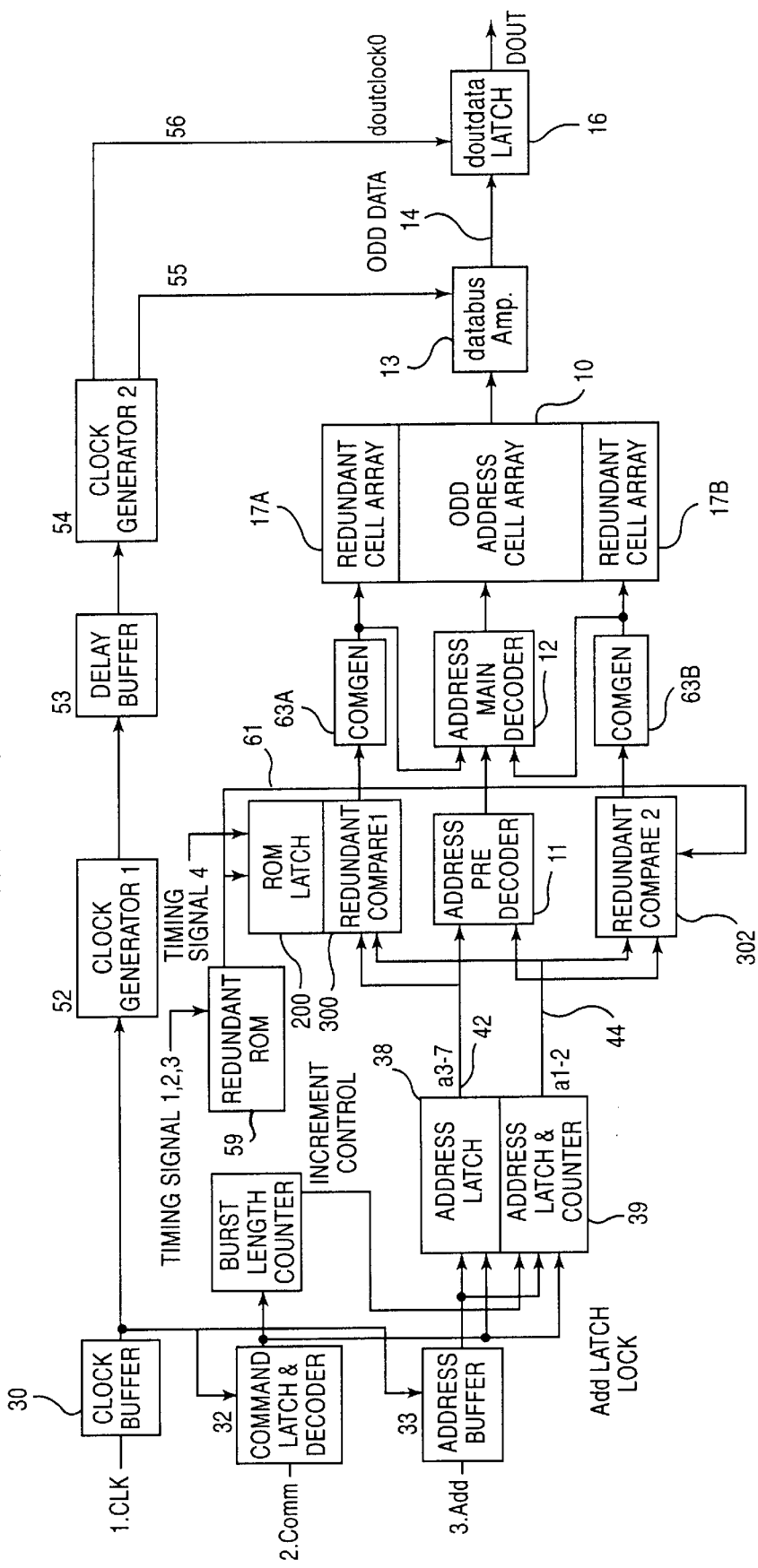
FIG. 19 depicts an overall circuit diagram of a fifth embodiment.

FIG. 19 depicts an overall circuit diagram of a fifth embodiment. This embodiment, like the second embodiment, applies different redundant addresses 61 to different redundant address comparators 300, 302 on a time-sharing basis. That is, only an odd cell array 10 is depicted in FIG. 19. In this example, two redundant cell arrays 17A, 17B are provided for a cell array 10. Consequently, a redundant address comparator 300, 302 and a redundant column selector 63A, 63B are provide for each redundant cell array 17A, 17B. Then, redundant addresses corresponding to two redundant cell arrays 17A, 17B are stored in a common redundant ROM 59, together with selection data of a plurality of redundant cell arrays 17A, 17B.

Then, initially, a redundant address corresponding to a redundant cell array 17A is outputted from a common redundant address terminal 61, latched to a latch circuit 200, and applied to a redundant address comparator 300. Thereafter, a redundant address corresponding to a redundant cell array 17B is outputted from a common redundant address terminal 61, and applied to a redundant address comparator 302. That is, different redundant addresses are applied to different redundant address comparators 300, 302 from a common redundant address terminal 61 on a time-sharing basis. Therefore, this embodiment is not limited to a multi-bit pre-fetch architecture.

The circuit architecture inside redundant ROM 59 for outputting redundant addresses on a time-sharing basis as described above is similar to the circuit architecture depicted in FIGS. 11, 12 and 13. In place of an odd/even array selector, a selector, which stores data for selecting a plurality of redundant cell arrays, can be provided. Then, the circuit architecture, in which a redundant address is outputted on a time-sharing basis, will be identical. Further, a latch circuit 20, which latches a redundant address outputted first, is also identical to a circuit depicted in FIG. 13.

The circuit architecture described above is one example, and the fact that the present invention can be achieved by other circuit architectures as well can be understood by an ordinary skilled person in this industry. In particular, the state of redundant address storage, and usage of fuses can be suitably modified by the ordinary skilled person of this industry.

As explained above, by virtue of the present invention, when a redundant cell array is provided for each of a first address group cell array and a second address group cell array in a multi-bit pre-fetch circuit architecture, a redundant ROM, which stores a redundant address, is provided in common for a first address group and a second address group, and this redundant ROM flexibly stores an address from a first address group and a second address group. Therefore, redundant ROM capacity can be made smaller than when dedicated redundant ROM are provided separately for a first address group and a second address group.

In addition, by virtue of the present invention, when a redundant cell array is provided for each of a first address group cell array and a second address group cell array in a multi-bit pre-fetch circuit architecture, a common redundant address comparator is provided for an upper column address, which, within a column address, is the same for a first address group and a second address group, and separate redundant address comparators are provided for lower column addresses a1, a2 . . . , which differ for the odd side and even side. Therefore, the scale of the upper redundant address comparator can be reduced.

What is claimed is:

1. A semiconductor memory, having a first address group cell array corresponding to a first address group and a second address group cell array corresponding to a second address group, said semiconductor memory comprising:

a first address group redundant cell array, which can be substituted for a defective cell of said first address group cell array;

a second address group redundant cell array, which can be substituted for a defective cell of said second address group cell array;

a redundant memory, which stores a first address group redundant address and a second address group redundant address corresponding to a defective cell, together with first and second address group selection data corresponding thereto, said redundant memory being provided commonly for said first and second address group redundant cell arrays and providing a redundant address validation signal together, with said redundant address;

a first address group redundant address comparator, provided commonly for the redundant memory, which compares a redundant address of said first address group supplied from said redundant memory with an address of a first address group being accessed when said redundant address validation signal being valid, and when they match, effectuates the selection of said first address group redundant cell array; and a second address group redundant address comparator, provided commonly for the redundant memory, which compares a redundant address of said second address group supplied from said redundant memory with an address of a second address group being accessed when said redundant address validation signal being valid, and when they match, effectuates the selection of said second address group redundant cell array.

2. The semiconductor memory according to claim 1, wherein said first address group cell array, and a first address group redundant cell array, and a second address group cell array, and a second address group redundant cell array are divided into a plurality of blocks; an address of a block corresponding to a stored redundant address is also stored in said redundant memory; and when an address of a block stored in said redundant memory matches an address to be accessed, the supplying of said stored redundant address to said redundant address comparator is effectuated.

3. The semiconductor memory according to the claims 1 or 2, wherein said redundant memory further comprises a transfer circuit, which outputs said redundant address separately in accordance with said first and second address group selection data; and said semiconductor memory further comprises a first address group redundant address line and a second address group redundant address line, which are respectively connected from said transfer circuit to said first address group redundant address comparator and a second address group redundant address comparator.

4. The semiconductor memory according to claims 1 or 2, further comprising a redundant address line, over which said redundant address, in accordance with said first and second address group selection data, is transmitted on a time sharing basis from said redundant memory to said first address group redundant address comparator and second address group redundant address comparator.

5. The semiconductor memory according to any of claim 1 or 2, wherein said first address group is an odd address, and said second address group is an even address.

6. The semiconductor memory according to claim 3, wherein said first address group is an odd address, and said second address group is even address.

7. The semiconductor memory according to claim 4, wherein said first address group is an odd address, and said second address group is even address.

8. The semiconductor memory according to claim 1 or 2, wherein the least significant bits of said first address group and second address group are any two from among "00", "01", "10" and "11".

9. The semiconductor memory according to claim 3, wherein the least significant bits of said first address group and second address group are any two from among "00", "01", "10" and "11".

10. The semiconductor memory according to claim 4, wherein the least significant bits of said first address group and second address group are any two from among "00", "01", "10" and "11".

11. A semiconductor memory, having a first column address group cell array corresponding to a first column address group and a second column address group cell array corresponding to a second column address group, and said cell arrays are divided into a plurality of blocks arranged in rows, the semiconductor memory comprising:

a first column address group redundant cell array, which is provided for each of said blocks, and which can be substituted for a defective cell of said first column address group cell array;

a second column address group redundant cell array, which is provided for each of said blocks, and which can be substituted for a defective cell of said second column address group cell array;

a redundant memory, which stores a first column address group redundant column address and a second column address group redundant column address corresponding to said defective cell, together with a row address for selecting a corresponding block, and first and second column address group selection data;

a first column address group redundant address comparator, which compares a redundant column address of said first column address group supplied from said redundant memory with a column address of a first column address group being accessed, and when they match, effectuates the selection of said first column address group redundant cell array; and a second column address group redundant address comparator, which compares a redundant column address of said second column address group supplied from said redundant memory with a column address of a second column address group being accessed, and when they match, effectuates the selection of said second column address group redundant cell array;

wherein when a row address to be accessed matches with a stored row address for said block selection, said redundant memory transmits on a time sharing basis said redundant column address in accordance with said first and second column address group selection data to said first column address group redundant address comparator and second column address group redundant address comparator.

12. The semiconductor memory according to claim 11, further comprising a latch circuit, which latches either a first address group or a second address group of said redundant column address outputted from said redundant memory.

13. The semiconductor memory according to claim 11 or 12, wherein said first address group is an odd address, and said second address group is an even address.

14. The semiconductor memory according to claim 11 or 12, wherein the least significant bits of said first address group and second address group are any two from among "00", "01", "10" and "11".

15. A semiconductor memory having a cell array and a plurality of redundant cell arrays, which can be substituted for defective cells of said cell array, said semiconductor memory comprising:

a redundant memory, which stores a plurality of redundant addresses corresponding to said defective cells, together with selection data of said plurality of redundant cell arrays, said redundant memory being provided commonly for said plurality of redundant cell arrays; and a plurality of redundant address comparators, each of which is provided for each of said redundant cell arrays;

wherein said redundant memory supplies to said plurality of redundant address comparators, on a time-sharing basis, the plurality of said stored redundant addresses in accordance with said selection data, and each of the redundant address comparators compares said redundant address supplied from said redundant memory with an address to be accessed, and when they match, effectuates a selection of a corresponding said redundant cell array.

16. The semiconductor memory according to claim 15, further comprising a latch circuit, which latches said redundant address outputted from said redundant memory.

17. A semiconductor memory, having a first address group cell array corresponding to a first address group and a second address group cell array corresponding to a second address group, said semiconductor memory comprising:

a first address group redundant cell array, which can be substituted for a defective cell of said first address group cell array;

a second address group redundant cell array, which can be substituted for a defective cell of said second address group cell array;

a redundant memory, which stores a first address group redundant address and a second address group redundant address corresponding to a defective cell, said redundant memory being provided commonly for said first and second address group redundant cell arrays;

a first address group redundant address comparator, which compares a redundant address of said first address group supplied from said redundant memory with an address of a first address group being accessed, and when they match, effectuates the selection of said first address group redundant cell array; and a second address group redundant address comparator, which compares a redundant address of said second address group supplied from said redundant memory with an address of a second address group being accessed, and when they match, effectuates the selection of said second address group redundant cell array;

wherein said first address group cell array, and a first address group redundant cell array, and a second address group cell array, and a second address group redundant cell array are divided into a plurality of blocks;

an address of a block corresponding to a stored redundant address is also stored in said redundant memory;

and when an address of a block stored in said redundant memory matches an address to be accessed, the supplying of said stored redundant address to said redundant address comparator is effectuated.

* * * * *